US008866158B2

(12) United States Patent
Hamada et al.

(10) Patent No.: US 8,866,158 B2
(45) Date of Patent: Oct. 21, 2014

(54) SEMICONDUCTOR DEVICE AND METHOD FOR MANUFACTURING SAME

(75) Inventors: Kenji Hamada, Tokyo (JP); Tsuyoshi Kawakami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/009,628

(22) PCT Filed: Mar. 29, 2012

(86) PCT No.: PCT/JP2012/058375
§ 371 (c)(1),
(2), (4) Date: Oct. 3, 2013

(87) PCT Pub. No.: WO2012/137659
PCT Pub. Date: Oct. 11, 2012

(65) Prior Publication Data
US 2014/0021489 A1 Jan. 23, 2014

(30) Foreign Application Priority Data

Apr. 4, 2011 (JP) .................................. 2011-082386

(51) Int. Cl.
*H01L 29/15* (2006.01)
*H01L 29/16* (2006.01)
(Continued)

(52) U.S. Cl.
CPC .......... *H01L 29/1608* (2013.01); *H01L 21/046* (2013.01); *H01L 29/66136* (2013.01);
(Continued)

(58) Field of Classification Search
CPC .............. H01L 21/046; H01L 29/1608; H01L 29/66128; H01L 29/0615; H01L 29/66136; H01L 29/8611; H01L 29/1095; H01L 29/66068

USPC ......... 438/518, 521, 527, 529, 542, 545, 546, 438/549, 570; 257/77, E21.049, E21.056, 257/E21.064, E21.135
See application file for complete search history.

(56) References Cited

U.S. PATENT DOCUMENTS

| 5,932,894 | A | 8/1999 | Bakowski et al. |
| 6,002,159 | A | 12/1999 | Bakowski et al. |
| 6,040,237 | A * | 3/2000 | Bakowski et al. ............ 438/521 |
| 7,919,403 | B2 * | 4/2011 | Tarui ............................. 438/542 |

FOREIGN PATENT DOCUMENTS

| JP | 10 270370 | 10/1998 |
| JP | 2000 516767 | 12/2000 |

(Continued)

OTHER PUBLICATIONS

International Preliminary Report on Patentability issued Oct. 17, 2013 in PCT/JP2012/058375 filed Mar. 29, 2012 submitting English translation only.

(Continued)

*Primary Examiner* — Brook Kebede
(74) *Attorney, Agent, or Firm* — Oblon, Spivak, McClelland, Maier & Neustadt, L.L.P.

(57) ABSTRACT

A semiconductor device having a high withstand voltage in which a stable withstand voltage can be obtained and a method for manufacturing the same. A JTE region having a second conductivity type is formed in a port ion on an outer peripheral end side of an SiC substrate from a second conductivity type SiC region in a vicinal portion of a surface on one of sides in a thickness direction of a first conductivity type SiC epitaxial layer. A first conductivity type SiC region having a higher concentration of an impurity having the first conductivity type than that of the SiC epitaxial layer is formed in at least a vicinal portion of a surface on one of sides in a thickness direction of a portion in which the JTE regions are bonded to each other.

9 Claims, 13 Drawing Sheets

(51) Int. Cl.
- *H01L 21/04* (2006.01)
- *H01L 29/66* (2006.01)
- *H01L 29/06* (2006.01)
- *H01L 29/861* (2006.01)
- *H01L 29/739* (2006.01)
- *H01L 29/78* (2006.01)
- *H01L 29/08* (2006.01)
- *H01L 29/872* (2006.01)

(52) U.S. Cl.
CPC ........ *H01L 29/7395* (2013.01); *H01L 29/0615* (2013.01); *H01L 29/0619* (2013.01); *H01L 29/7811* (2013.01); *H01L 29/66128* (2013.01); *H01L 29/8611* (2013.01); *H01L 29/0878* (2013.01); *H01L 29/872* (2013.01)

USPC .......................................................... 257/77

FOREIGN PATENT DOCUMENTS

| | | |
|---|---|---|
| JP | 2002 507325 | 3/2002 |
| JP | 2008 227236 | 9/2008 |

OTHER PUBLICATIONS

Written Opinion issued May 29, 2012 in PCT/JP2012/058375 filed Mar. 29, 2012 with English language translation.

Baliga, J.B., "Fundamentals of Power Semiconductor Devices", pp. 149- 155, (2008).

International Search Report Issued May 29, 2012 in PCT/JP12/058375 Filed Mar. 29, 2012.

Office Action mailed Sep. 9, 2014, in Japanese Patent Application No. 2013-508830 (with partial English-language translation).

\* cited by examiner

F I G. 1
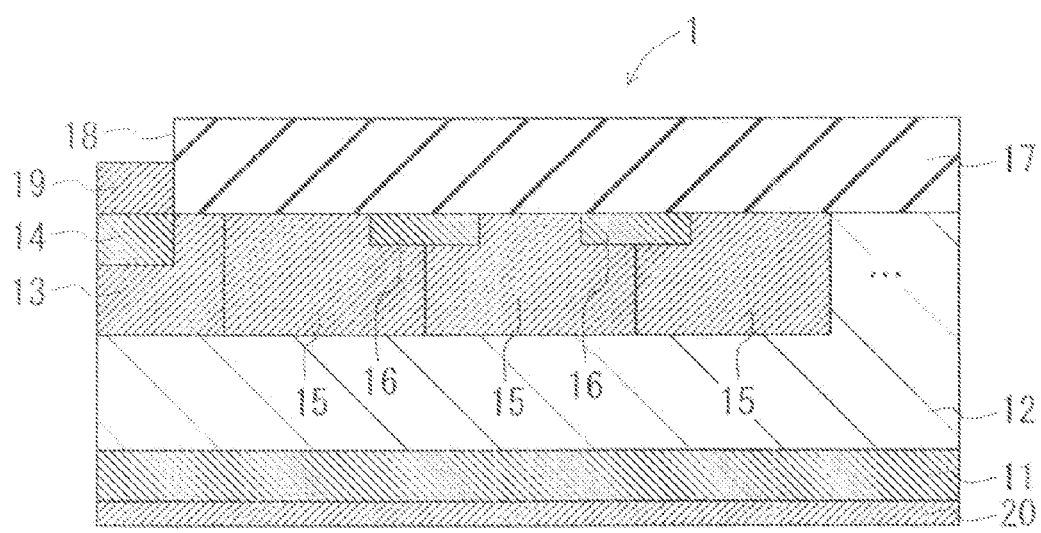

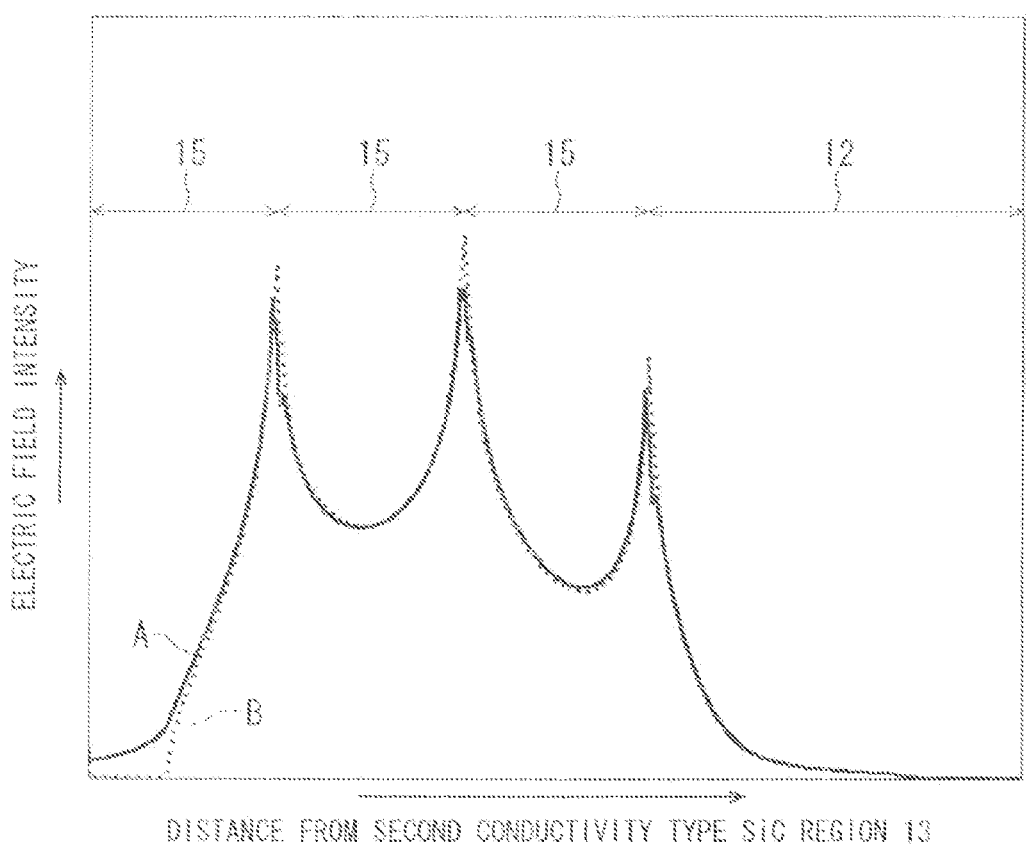

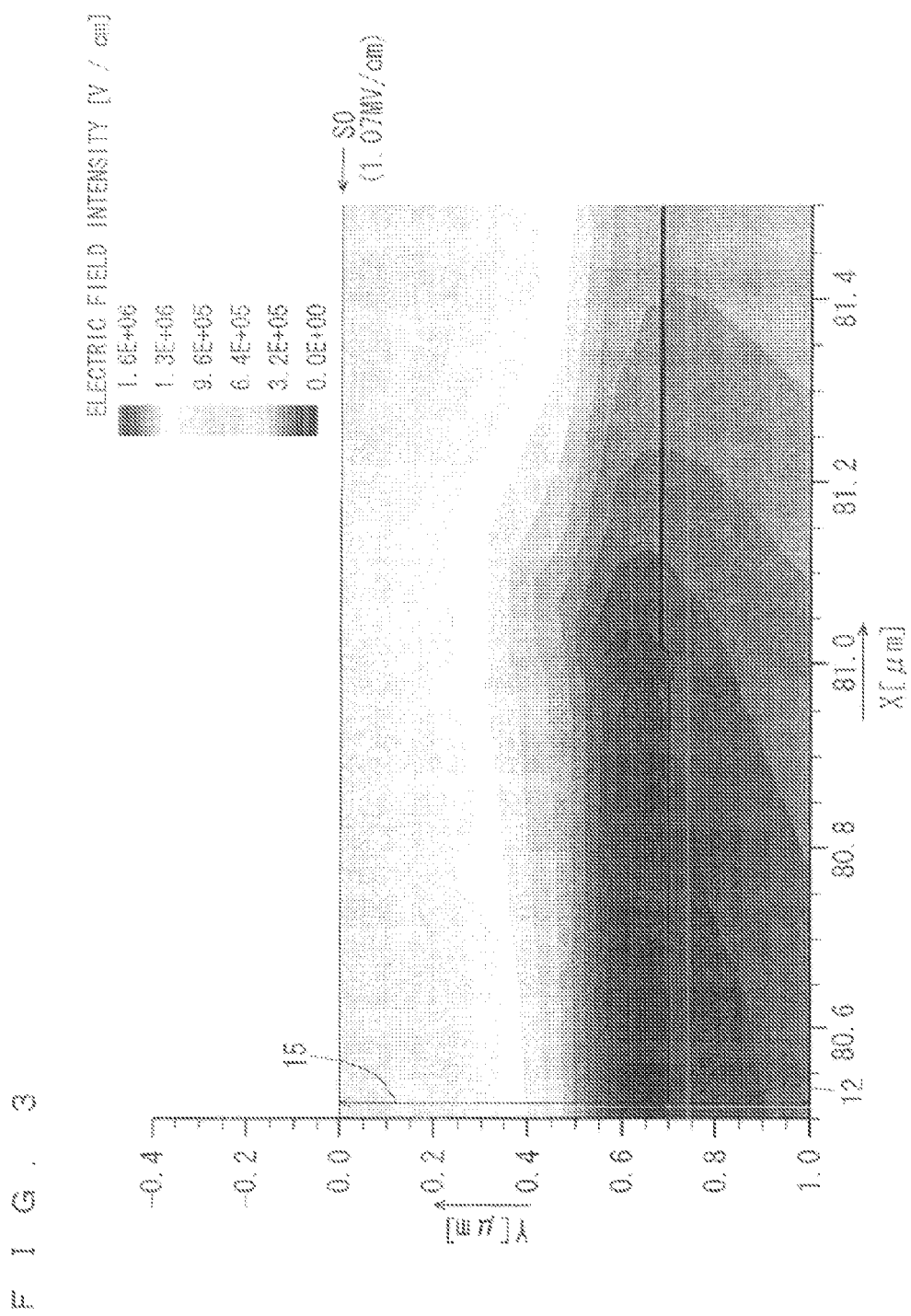

F I G . 2 3
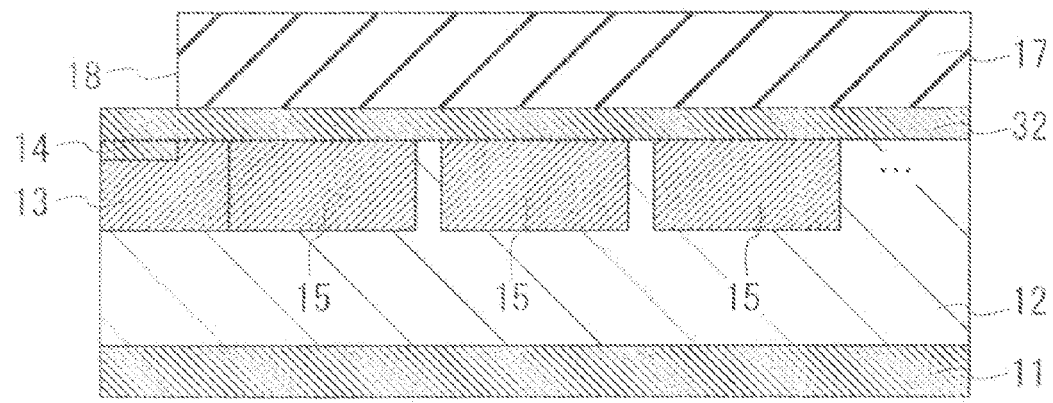

US 8,866,158 B2

SEMICONDUCTOR DEVICE AND METHOD FOR MANUFACTURING SAME

TECHNICAL FIELD

The present invention relates to a semiconductor device and a method for manufacturing the same, and more particularly to a semiconductor device in which a JTE (Junction Termination Extension) region is formed in a silicon carbide (SiC) substrate, and a method for manufacturing the same.

BACKGROUND ART

A power semiconductor device includes a Schottky diode, a pn diode, an MOSFET (Metal Oxide Semiconductor Field Effect Transistor) and the like which use a silicon carbide (SiC) substrate. In these power semiconductor devices, various termination structures are introduced in order to prevent an electric field from concentrating on a pn junction portion in the SiC substrate. The termination structure includes a JTE (Junction Termination Extension) structure (for example, see Non-Patent Document 1).

The JTE structure has a feature that it can easily be formed by ion implantation. Moreover, the JTE structure also has a feature that it can easily be designed because a carrier concentration of a JTE region is preferably designed in order to cause the JTE region to be perfectly depleted in a dielectric breakdown.

Referring to a semiconductor device having the JTE structure (which will be hereinafter referred to as a "device" in some cases), the following techniques are proposed in order to reduce an electric field intensity on a surface of the JTE region. For example, in Patent Document 1, the technique for giving a concentration gradient to a JTE region is proposed. In Patent Document 2, moreover, there is proposed the technique for covering a pn junction and a JTE region with a third layer. By these techniques, a semiconductor device having a high withstand voltage is attempted to be implemented.

PRIOR ART DOCUMENTS

Patent Documents

Patent Document 1: Japanese Translation of PCT International Application Publication No. 2000-516767
Patent Document 2: Japanese Translation of PCT International Application Publication No. 2002-507325

Non-Patent Document

Non-Patent Document 1: B. Jayant Baliga, "FUNDAMENTALS OF POWER SEMICONDUCTOR DEVICES", p 149-p 155

SUMMARY OF THE INVENTION

Problems to be Solved by the Invention

In the semiconductor devices having a high withstand voltage disclosed in Patent Document 1 and Patent Document 2, a peak of an electric field intensity is generated between JTE regions or in a junction portion of the JTE region and an epitaxial layer when a comparatively high reverse voltage is applied to a pn junction. There is a problem in that creeping discharge is generated on an outside of a substrate and the withstand voltage of the semiconductor device is thus dropped remarkably if a peak value of the electric field intensity reaching a surface of the substrate is great. In addition, there is a problem in that the peak value of the electric field intensity is gradually increased with a rise in the withstand voltage in a withstand specification of the semiconductor device.

The JTE structure for controlling the peak value of the electric field intensity includes the structure in which a concentration gradient is given to the JTE region as disclosed in Patent Document 1 and the structure in which the pn junction and the JTE region are covered with the third layer as disclosed in Patent Document 2.

With the JTE structure disclosed in Patent Document 1 and Patent Document 2, however, the JTE regions do not always have a retrograde distribution. The "retrograde distribution" indicates a distribution having a peak of an impurity concentration at a back side of a substrate, that is, an inner side from a surface on one of sides in a thickness direction of the JTE region.

More specific description will be given. With the JTE structures disclosed in Patent Document 1 and Patent Document 2, the high impurity region having a comparatively high impurity concentration is formed to reach the surface of the JTE region. Accordingly, there is a problem in that the peak value of the electric field intensity reaching the surface of the JTE region or the surface of the device cannot be reduced sufficiently.

With the JTE structure disclosed in Patent Document 2, moreover, the third layer covering the pn junction and the JTE region does not always have a higher impurity concentration than the drift layer. When a comparatively high reverse voltage is applied to the device, accordingly, the third layer is perfectly depleted to hold the electric field. For this reason, there is a problem in that it is impossible to sufficiently reduce the peak value of the electric field intensity which reaches the surface of the device.

It is an object of the present invention to provide a semiconductor device having a high withstand voltage in which a stable withstand voltage can be obtained, and a method for manufacturing the same.

Means for Solving the Problems

A semiconductor device according to the present invention includes a silicon carbide substrate having a first conductivity type, a silicon carbide layer provided on a surface at one of sides in a thickness direction of the silicon carbide substrate and having the first conductivity type, a second conductivity type region formed in a part of a vicinal portion of a surface on one of sides in a thickness direction of the silicon carbide layer and having a second conductivity type, and a plurality of junction termination regions formed in a portion on an outer peripheral end side of the silicon carbide substrate from the second conductivity type region in the vicinal portion of the surface at one of the sides in the thickness direction of the silicon carbide layer and having the second conductivity type, and the plurality of junction termination regions are formed adjacently to each other or apart from each other in at least the surface on one of the sides in the thickness direction of the silicon carbide layer, and a first conductivity type region having the first conductivity type and a higher concentration of an impurity having the first conductivity type than that of the silicon carbide layer is formed in at least a vicinal portion of a surface on one of sides in a thickness direction of a portion in which the junction termination regions are bonded to each other or a portion provided between the junction termination regions which are disposed apart from each other, and the first conductivity type region is formed across the junction termination regions which are adjacent to each other.

Moreover, a method for manufacturing a semiconductor device according to the present invention includes a silicon carbide layer forming step of forming a silicon carbide layer having a first conductivity type over a surface at one of sides in a thickness direction of a silicon carbide substrate having the first conductivity type, a second conductivity type region forming step of forming a second conductivity type region having a second conductivity type in a part of a vicinal portion of a surface on one of sides in a thickness direction of the silicon carbide layer, a termination region forming step of carrying out an ion implantation treatment over a portion on an outer peripheral end side of the silicon carbide substrate from the second conductivity type region in the vicinal portion of the surface at one of the sides in the thickness direction of the silicon carbide layer, thereby forming a plurality of junction termination regions having the second conductivity type adjacently to each other or apart from each other in at least the surface on one of the sides in the thickness direction of the silicon carbide layer, and a first conductivity type region forming step of carrying out an ion implantation treatment in at least a vicinal portion of a surface on one of sides in a thickness direction of a portion in which the junction termination regions are bonded to each other or a portion provided between the junction termination regions which are disposed apart from each other, thereby forming a first conductivity type region having the first conductivity type and a higher concentration of an impurity having the first conductivity type than that of the silicon carbide layer, and at the first conductivity type region forming step, the first conductivity type region is formed across said junction termination regions which are adjacent to each other.

Effects of the Invention

According to the semiconductor device in accordance with the present invention, in the case in which a comparatively high reverse voltage is applied to the pn junction, the first conductivity type region serves as an electric field shield. Moreover, depletion in the surface at one of the sides in the thickness direction of the junction termination region can be suppressed by the first conductivity type region. Therefore, a portion in the junction termination region in which an electric field intensity is the highest can be positioned on the other side in the thickness direction from the surface on one of the sides in the thickness direction of the junction termination region. Consequently, it is possible to reduce a peak value of the electric field intensity which reaches the surface on one of the sides in the thickness direction of the junction termination region or the surface on one of the sides in the thickness direction of the silicon carbide layer including the junction termination region. Therefore, it is possible to suppress creeping discharge on an outside of a substrate constituted by the silicon carbide layer and the silicon carbide substrate. Accordingly, it is possible to prevent a withstand voltage of the semiconductor device from being dropped. Consequently, it is possible to implement a semiconductor device having a high withstand voltage in which a stable withstand voltage can be obtained.

According to the method for manufacturing a semiconductor device in accordance with the present invention, moreover, it is possible to provide the semiconductor device having a high withstand voltage according to the present invention in which a stable withstand voltage can be obtained as described above.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a sectional view showing a structure of a semiconductor device 1 according to a first embodiment of the present invention.

FIG. 2 is a graph showing a relationship between electric field intensities reaching substrate surfaces S0 in two types of JTE structures and a distance from a second conductivity type SiC region 13.

FIG. 3 is a chart showing a simulation result of a comparative JTE structure B.

FIG. 23 is a sectional view showing a further example of the first conductivity type SiC region.

EMBODIMENT FOR CARRYING OUT THE INVENTION

First Embodiment

Figure 4:
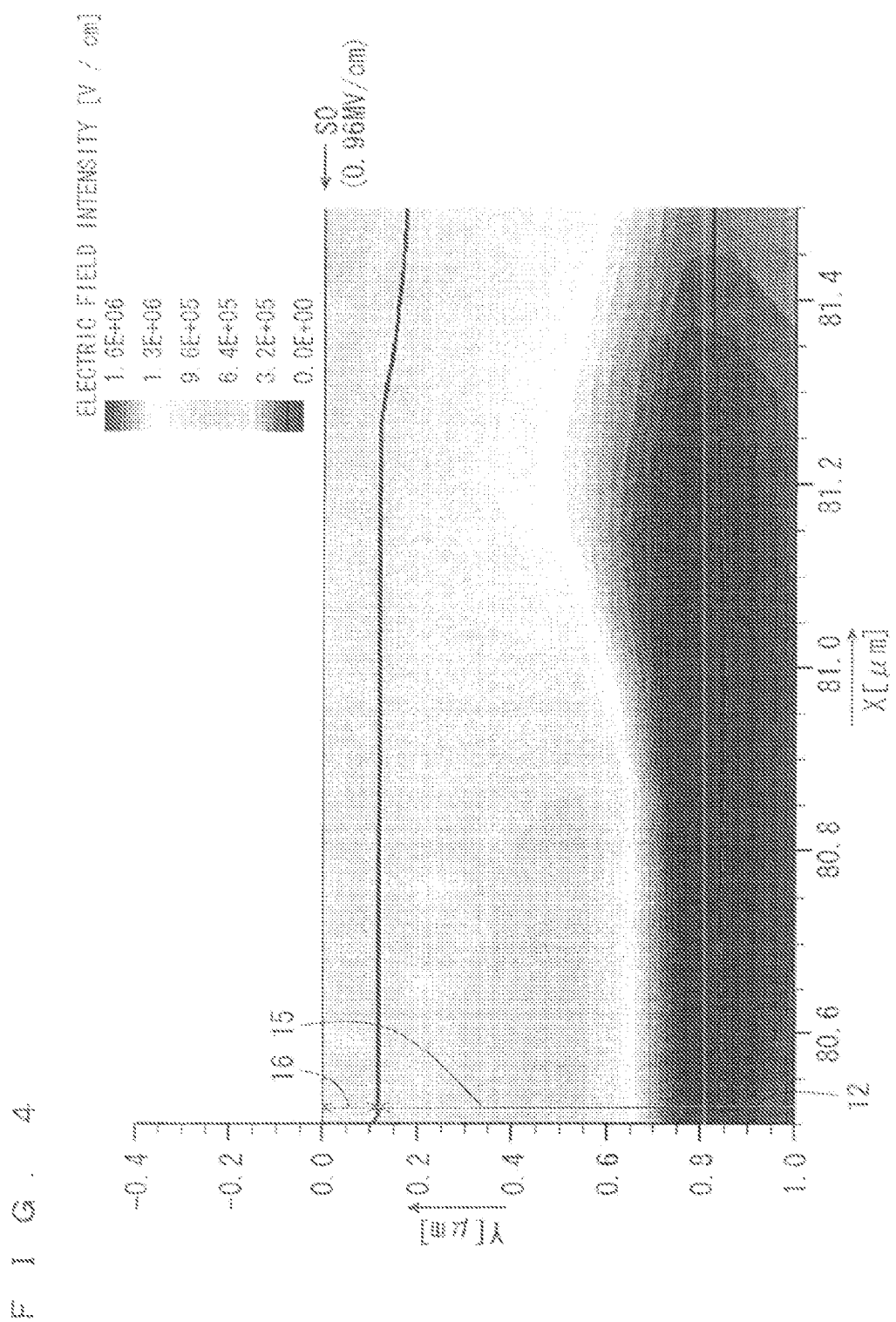
FIG. 4 is a chart showing a simulation result of the present JTE structure A.

FIG. 1 is a sectional view showing a structure of a semiconductor device 1 according to a first embodiment of the present invention. The semiconductor device 1 according to the present embodiment is a pn diode. The semiconductor device 1 is constituted to include a silicon carbide (SiC) substrate 11, an SiC epitaxial layer 12, a second conductivity type SiC region 13, an ohmic contact region 14, a junction termination extension (abbreviation: JTE) region 15, a first conductivity type SiC region 16, a protective film 17, an anode electrode 19 and a cathode electrode 20.

The SiC epitaxial layer 12 corresponds to a silicon carbide layer. The second conductivity type SiC region 13 corresponds to a second conductivity type region. The JTE region 15 corresponds to a junction termination region. The first conductivity type SiC region 16 corresponds to a first conductivity type region.

In the following description, the combination of the SiC substrate 11, the SiC layer to be the semiconductor layer provided on the SiC substrate 11 and the SiC epitaxial layer 12 in the present embodiment is referred to as an "SiC substrate" or a "substrate" in some cases. In these cases, the substrate is plate-shaped and includes the respective regions formed in the SiC epitaxial layer 12, that is, the second conductivity type SiC region 13, the ohmic contact region 14, the JTE region 15 and the first conductivity type SiC region 16.

FIG. 1 shows only an outer peripheral end of the substrate (which will be hereinafter referred to as an "outermost edge" in some cases) and the vicinity thereof, and an inside part thereof is not shown. In FIG. 1, a right side of a paper corresponds to the outer peripheral end side of the substrate and a left side of the paper corresponds to an inside of the outer peripheral end of the substrate. In the present embodiment, "the outer peripheral end of the substrate" corresponds to "the outer peripheral end of the SiC substrate 11" and "the inside of the outer peripheral end of the substrate" corresponds to "an inside of the outer peripheral end of the SiC substrate 11".

The SiC epitaxial layer 12 is provided on a surface at one of sides in a thickness direction of the SiC substrate 11. The SiC substrate 11 and the SiC epitaxial layer 12 have a first conductivity type.

The JTE region 15 is formed in a vicinal portion of a surface at one of sides in a thickness direction of the SiC epitaxial layer 12. The "vicinal portion of the surface" includes the surface and the vicinal portion thereof. The semiconductor device 1 includes a plurality of JTE regions 15. Although three JTE regions 15 are shown in FIG. 1, four JTE regions 15 or more may be provided. The JTE regions 15 are arranged side by side in a perpendicular direction to the thickness direction of the SiC substrate 11 (which will be hereinafter referred to as a "lateral direction" in some cases) toward the outermost edge of the semiconductor device 1. In FIG. 1, the lateral direction is equivalent to a transverse direction toward the paper.

In the present embodiment, the JTE regions 15 are provided adjacently in the lateral direction. Herein, "provided adjacently" implies that they are provided in contact without an interval. Accordingly, each of the JTE regions 15 is bonded to the other JTE region 15 which is adjacent thereto in the lateral direction.

The second conductivity type SiC region 13 is formed in a region at an inside of the substrate from the JTE region 15 in the lateral direction in the vicinal portion of the surface on one of the sides in the thickness direction of the SiC epitaxial layer 12. The second conductivity type SiC region 13 is provided in contact with any of the JTE regions 15 which are provided on an innermost side of the substrate in the lateral direction. The second conductivity type SiC region 13 is formed over a central part in the thickness direction of the SiC epitaxial layer 12 from the surface on one of the sides in the thickness direction. The second conductivity type SiC region 13 has the second conductivity type.

The ohmic contact region 14 is formed apart from the JTE region 15 in a part of the vicinal portion of the surface on one of the sides in the thickness direction of the second conductivity type SiC region 13. The ohmic contact region 14 is formed more shallowly than the second conductivity type SiC region 13. For example, the ohmic contact region 14 is formed to reach a depth of approximately two-fifths (2/5) of a depth of the second conductivity type SiC region 13 from the surface on one of the sides in the thickness direction of the second conductivity type SiC region 13. The ohmic contact region 14 has the second conductivity type. An impurity concentration of the ohmic contact region 14 is higher than an impurity concentration of the second conductivity type SiC region 13.

Any of the JTE regions (which will be hereinafter referred to as "the JTE region on an inner side" in some cases) 15 to be provided on the innermost side of the substrate in the lateral direction is disposed adjacently to the second conductivity type SiC region 13 in the lateral direction. More specifically, the JTE region 15 on the inner side is adjacent to the second conductivity type SiC region 13 as seen from one of the sides in the thickness direction of the substrate and is provided to surround the second conductivity type SiC region 13. The other JTE regions 15 are adjacent to the JTE regions 15 on the inner side as seen from one of the sides in the thickness direction of the substrate and are provided to surround the JTE region 15 on the inner side.

In the present embodiment, the SiC substrate 11 takes a rectangular planar shape seen from one of the sides in the thickness direction. The second conductivity type SiC region 13 is formed to take an annular planar shape seen from one of the sides in the thickness direction, more specifically, an almost rectangular and annular shape along the outer peripheral end of the SiC substrate 11. Each of the JTE regions 15 is formed to take an annular planar shape seen from one of the sides in the thickness direction, more specifically, an almost rectangular and annular shape along the second conductivity type SiC region 13.

Each of the JTE regions 15 has the second conductivity type. An impurity concentration of each of the JTE regions 15 is lower than the impurity concentration of the second conductivity type SiC region 13. The impurity concentration of each of the JTE regions 15 has a concentration distribution for stepwise decrease from the second conductivity type SiC region 13 toward the SiC epitaxial layer 12 in the lateral direction, that is, from the inner side of the substrate toward the outermost edge side in the lateral direction. Differently from the present embodiment, the impurity concentration of each of the JTE regions 15 may have a uniform concentration distribution wholly in the lateral direction.

The JTE regions 15 are arranged on the outermost edge side from the inner side of the substrate in descending order of a surface density of an impurity having the second conductivity type (which will be hereinafter referred to as a "second conductivity type impurity" in some cases). In other words, the JTE regions 15 are disposed in such a manner that the surface density of the second conductivity type impurity is gradually decreased from the inner side of the substrate toward the outermost edge side. The surface density is equal to an integral of a volume impurity density over a thickness of an impurity region. In the case in which the volume impurity concentration is constant over the thickness of the impurity region, the surface density is equal to a product of the volume impurity concentration and the thickness of the impurity region.

The first conductivity type SiC region 16 is provided in a portion (hereinafter referred to as a "junction portion" in some cases) in which the JTE regions 15 are bonded to each other in the vicinal portion of the surface on one of the sides in the thickness direction of the JTE region 15. In other words, the first conductivity type SiC region 16 is provided across the two of the JTE regions 15 which are adjacent to each other in the lateral direction. The first conductivity type SiC region 16 is provided in each of the junction portions of the JTE regions 15. In other words, the semiconductor device 1 includes the first conductivity type SiC regions 16. The first conductivity type SiC regions 16 are provided side by side at a predetermined interval in the lateral direction.

Each of the first conductivity type SiC regions 16 is formed more shallowly than the JTE region 15. For example, each of the first conductivity type SiC regions 16 is formed to reach a depth of approximately one-third (⅓) of the thickness of the JTE region 15 from the surface on one of the sides in the thickness direction of the JTE region 15. Each of the first conductivity type SiC regions 16 has the first conductivity type.

The protective film 17 is provided on the surface at one of the sides in the thickness direction of the SiC epitaxial layer 12. The protective film 17 has an opening portion 18 in a corresponding position to a region in which the ohmic contact region 14 is formed. An opening which is opened to one of the sides in the thickness direction of the substrate is formed on the opening portion 18. The ohmic contact region 14 is exposed to one of the sides in the thickness direction through the opening formed on the opening portion 18.

The anode electrode 19 is provided in the opening of the opening portion 18 of the protective film 17. The anode electrode 19 is provided in contact with the ohmic contact region 14. The anode electrode 19 is electrically connected to the second conductivity type SiC region 13 through the ohmic contact region 14.

The cathode electrode 20 is provided on a surface at the other side in the thickness direction of the SiC substrate 11. The cathode electrode 20 is provided opposite to the anode electrode 19 as shown in FIG. 1.

In the present embodiment, the first conductivity type is set to be an n type and the second conductivity type is set to be a p type. Accordingly, the SiC substrate 11, the SiC epitaxial layer 12 and the first conductivity type SiC region 16 have the n-type conductivity, and the second conductivity type SiC region 13, the ohmic contact region 14 and the JTE region 15 have the p-type conductivity.

As described above, in the semiconductor device 1 according to the present embodiment, the first conductivity type SiC region 16 is present in the vicinal portion of the surface on one of the sides in the thickness direction in the junction portion of the JTE regions 15, and furthermore, the second conductivity type SiC region 13 is present from the surface on one of the sides in the thickness direction of the SiC epitaxial layer 12 to a deeper position than the first conductivity type SiC region 16.

Also in the case in which an electric field concentrates on the junction portion of the JTE regions 15 so that a peak of an electric field intensity is generated when a comparatively high reverse voltage is applied to the pn junction, consequently, it is possible to reduce the peak value of the electric field intensity which reaches the surface on one of the sides in the thickness direction of the SiC epitaxial layer 12. Accordingly, it is possible to implement the semiconductor device 1 having a high withstand voltage in which a stable withstand voltage can be obtained.

The effects of the semiconductor device 1 according to the present embodiment have been confirmed by the following simulation results. The simulation will be described below in detail. Referring to the simulation investigated by the inventor of the present application, each element is set to have the following value on the assumption that a semiconductor device having a withstand voltage of 3300 V, more specifically, a pn diode is manufactured.

The impurity concentration of the SiC epitaxial layer 12 is set to be $3\times10^{15}/cm^3$ and a dimension in the thickness direction (which will be hereinafter referred to as a "thickness") is set to be 30 μm. Moreover, the impurity concentration of the second conductivity type SiC region 13 is set to be $3\times10^{18}/cm^3$ and a thickness, that is, a depth from the surface on one of the sides in the thickness direction of the SiC epitaxial layer 12 is set to be equal to or smaller than 0.8 μm. Furthermore, three JTE regions 15 are formed as the JTE regions and implantation surface densities toward the outermost edge are set to be $1.2\times10^{13}/cm^2$, $7.8\times10^{12}/cm^2$, and $3.9\times10^{12}/cm^2$, respectively. The "implantation surface density" indicates a surface density of an impurity in ion implantation. In addition, the thickness of each of the JTE regions 15, that is, the depth from the surface on one of the sides in the thickness direction of the SiC epitaxial layer 12 is set to be equal to or smaller than 0.8 μm.

For comparison, it is assumed that two types of JTE structures are formed. With a first one of the types of the JTE structures, the JTE region 15 is formed in such an implantation profile that an impurity concentration is constant in the depth direction of the JTE region 15.

With a second one of the types of the JTE structures, the JTE region 15 is formed in such an implantation profile that the impurity concentration in the vicinal portion of the surface on one of the sides in the thickness direction of the JTE region 15 is lower than an implantation peak which is a peak of the impurity concentration in the ion implantation. In other words, with the second one of the types of the JTE structures, the concentration of the second conductivity type impurity in each of the JTE regions 15 has a maximum value on the other side in the thickness direction of each of the JTE regions 15 as compared with the surface on one of the sides in the thickness direction. With the second one of the types of the JTE structures, moreover, the first conductivity type SiC region 16 is formed in the vicinal portion of the surface of the junction portion between the JTE regions 15. In other words, the second one of the types of the JTE structures serves as the JTE structure in the semiconductor device 1 according to the present embodiment.

An impurity concentration of the first conductivity type SiC region 16 in the second one of the types of the JTE structures is set to be $1\times10^{17}/cm^3$ and a thickness, that is, a depth from the surface on one of the sides in the thickness direction of the SiC epitaxial layer 12 is set to be 0.1 μm. In the following description, the second one of the types of the JTE structures will be referred to as "a JTE structure A according to the present application" and the first one of the types of the JTE structures will be referred to as "a comparative JTE structure B" in some cases. Moreover, their combination will be referred to as "JTE structures A and B" in some cases. In these two types of the JTE structures A and B, the surface on one of the sides in the thickness direction of the SiC epitaxial layer 12 will be referred to as a "substrate surface S0" in some cases. It is assumed that a comparatively high reverse voltage of 3300 V is applied to the pn diode serving as the semiconductor device 1 in which these two types of JTE structures A and B are formed.

FIG. 2 is a graph showing a relationship between electric field intensities which reach the substrate surface S0 in the two types of JTE structures and a distance from the second conductivity type SiC region 13. FIGS. 3 and 4 are charts showing a simulation result for an electric field distribution. FIG. 3 is a chart showing a simulation result for the comparative JTE structure B and FIG. 4 is a chart showing a simulation result for the JTE structure A according to the present invention. In FIG. 2, an axis of abscissa indicates the distance from the second conductivity type SiC region 13 and an axis of ordinate indicates an electric field intensity. In FIGS. 3 and 4, an axis of abscissa indicates a distance X [μm] from the second conductivity type SiC region 13, and an axis of ordinate indicates a distance Y [μm] from the substrate surface S0. A direction of the axis of abscissa in FIGS. 2 to 4 corresponds to the lateral direction of the substrate, that is, the transverse direction of the paper in FIG. 1.

In FIG. 2, referring to the two types of the JTE structures A and B, the electric field to reach the substrate surface S0 is indicated as a function of the distance from the second conductivity type SiC region 13. In FIGS. 3 and 4, referring to the two types of the JTE structures A and B, there is shown an electric field distribution in the junction portion between the JTE regions 15 in which the electric field is the highest.

From the simulation result shown in FIG. 3, it was found that the peak value of the electric field intensity to reach the substrate surface S0 in the junction portion between the JTE regions 15 is 1.07 MV/cm in the case of the comparative JTE structure B in which the JTE region 15 is formed in such an implantation profile that the impurity concentration is constant in the depth direction of the JTE region 15.

From the simulation result shown in FIG. 4, moreover, it was found that the peak value of the electric field intensity to reach the substrate surface S0 in the junction portion between the JTE regions 15 is 0.96 MV/cm in the case of the JTE structure A according to the present invention in which the JTE region 15 is formed in such an implantation profile that an impurity concentration on the surface side at one of the sides in the thickness direction of the JTE region 15 is lower than an implantation peak and the first conductivity type SiC region 16 is formed in the vicinal portion of the surface of the junction portion between the JTE regions 15. From the results described above, it is apparent that the following effects can be obtained.

With the JTE structure A according to the present invention, the JTE region 15 is formed in such an implantation profile that the impurity concentration on the surface side at one of the sides in the thickness direction of the JTE region 15 is lower than the implantation peak, and the first conductivity type SiC region 16 is formed in the vicinal portion of the surface on one of the sides in the thickness direction in the junction portion between the JTE regions 15 as described above.

In the case in which a comparatively high reverse voltage is applied to the pn junction, consequently, an electric field concentrates on only a region having a comparatively higher impurity concentration (which will be hereinafter referred to as a "high impurity region" in some cases) on a back side of the substrate, more specifically, an inner side of the surface on one of the sides in the thickness direction in the JTE region 15. In addition, the first conductivity type SiC region 16 serves as an electric field shield so that it is possible to reduce the peak value of the electric field intensity which reaches the substrate surface S0. Accordingly, creeping discharge on the outside of the substrate is suppressed. Therefore, it is possible to prevent a drop in the withstand voltage of the semiconductor device and to implement the semiconductor device 1 having a high withstand voltage in which a stable withstand voltage can be obtained.

It is preferable that the concentration of the second conductivity type impurity in the surface on one of the sides in the thickness direction of each of the JTE regions 15 should be equal to or lower than one-tenth (1/10) of the maximum value in the thickness direction. By setting the concentration of the second conductivity type impurity in the surface on one of the sides in the thickness direction of each of the JTE regions 15 to be equal to or lower than one-tenth (1/10) of the maximum value in the thickness direction, it is possible to further reduce the peak value of the electric field intensity which reaches the surface of the substrate as compared with the case in which the concentration of the second conductivity type impurity is higher than one-tenth of the maximum value in the thickness direction. Consequently, it is possible to suppress the creeping discharge on the outside of the substrate still more. Therefore, it is possible to prevent the drop in the withstand voltage of the semiconductor device 1 more reliably. Accordingly, it is possible to implement a semiconductor device having a high withstand voltage in which a further stable withstand voltage can be obtained.

As described above, the inventor according to the present invention compared the two types of the JTE structures A and B through the simulation. Referring to the comparative JTE structure B, the JTE region 15 is formed in such an implantation profile that the impurity concentration is constant in the depth direction of the JTE region 15. Referring to the JTE structure A according to the present invention, the JTE region 15 is formed in such an implantation profile that the impurity concentration in the vicinal portion of the surface on one of the sides in the thickness direction of the JTE region 15 is lower than the implantation peak which is the peak of the impurity concentration in the ion implantation, and the first conductivity type SiC region 16 is formed in the vicinal portion of the surface of the junction portion between the JTE regions 15.

The inventor of the present application further carried out the investigation through the simulation. As a result, it was found that the peak value of the electric field intensity reaching the surface of the substrate can be reduced dramatically by intentional increase in the impurity concentration of the first conductivity type SiC region 16 formed in the vicinal portion of the surface of the junction portion between the JTE regions 15 as compared with the impurity concentration of the SiC epitaxial layer 12 serving as the drift layer.

The effect has been confirmed based on the simulation result which will be described below. The simulation will be described below in detail. Referring to the simulation investigated by the inventor of the present application, each element is set to have the following value on the assumption that the semiconductor device having a withstand voltage of 3300 V, more specifically, the pn diode is manufactured.

An n-type impurity to be the first conductivity type impurity is set to be nitrogen (N). A p-type impurity to be the second conductivity type impurity is set to be aluminum (Al). The impurity concentration of the SiC epitaxial layer 12 is set to be $3 \times 10^{15}/cm^3$ and a thickness is set to be 30 μm. Moreover, the impurity concentration of the second conductivity type SiC region 13 is set to be $3 \times 10^{18}/cm^3$ and a thickness, that is, a depth from the surface on one of the sides in the thickness direction of the SiC epitaxial layer 12 is set to be approximately 1.5 μm.

As the JTE region 15, moreover, three JTE regions 15 are formed side by side in the lateral direction of the substrate. The three JTE regions 15 are formed as a first JTE region 15, a second JTE region 15 and a third JTE region 15 in order from the inner side of the substrate toward the outermost edge, and a condition for forming each of the JTE regions 15 is set as follows. Referring to the first JTE region 15, an implantation energy is set to be 500 keV and an implantation dose amount is set to be $1.5 \times 10^{13}/cm^2$. Referring to the second JTE region 15, an implantation energy is set to be 500 keV and an implantation dose amount is set to be $1.0 \times 10^{13}/cm^2$. Referring to the third JTE region 15, an implantation energy is set to be 500 keV and an implantation dose amount is set to be $5.0 \times 10^{12}/cm^2$.

For comparison, it is assumed that two types of JTE structures are formed. A first one of the types of the JTE structures is a structure in which the first conductivity type SiC region 16 is formed in the vicinal portion of the surface of the junction portion between the JTE regions 15 (which will be hereinafter referred to as "a JTE structure C according to the present application" in some cases). A second one of the types of the JTE structures is a structure in which the first conductivity type SiC region 16 is not formed in the vicinal portion of the surface of the junction portion between the JTE regions 15 (which will be hereinafter referred to as a "comparative JTE structure D" in some cases).

Figure 15:
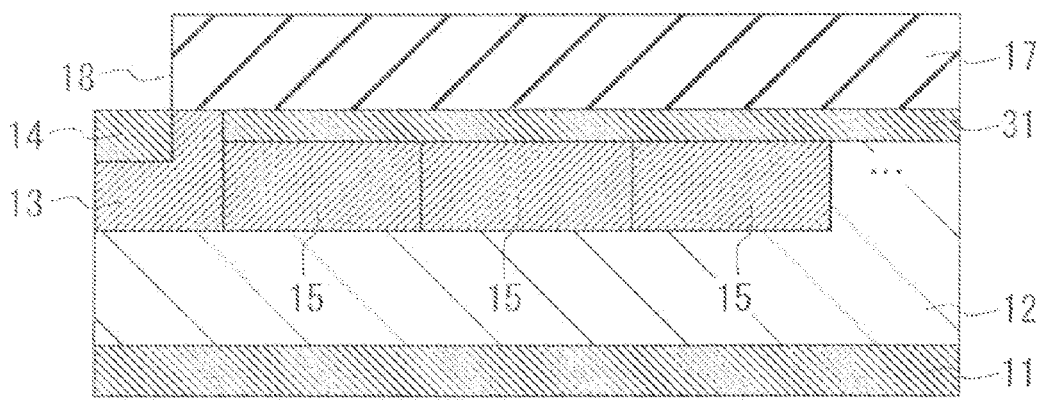
FIG. 15 is a sectional view showing yet another example of the first conductivity type SiC region.

Referring to the JTE structure C according to the present application, an implantation energy is set to be 75 keV and an implantation dose amount is set to be $1.0 \times 10^{12}/cm^2$ as a condition for forming the first conductivity type SiC region 16. For simplicity of the simulation, moreover, it is assumed that the first conductivity type SiC region 16 is formed over the whole vicinal portion of the surface on one of the sides in the thickness direction of the termination region constituted by the JTE regions 15 as shown in FIG. 15 which will be described below. Such a first conductivity type SiC region is indicated as the reference numeral "31" in FIG. 15.

Figure 5:
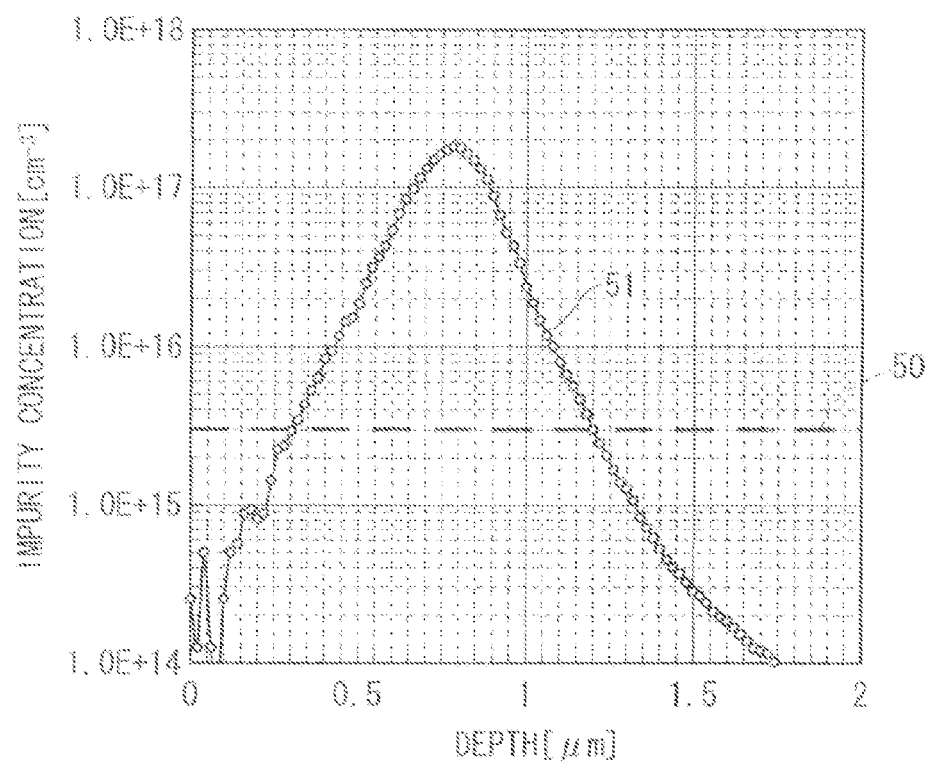
FIG. 5 is a chart showing an impurity profile of a comparative JTE structure D.
Figure 6:
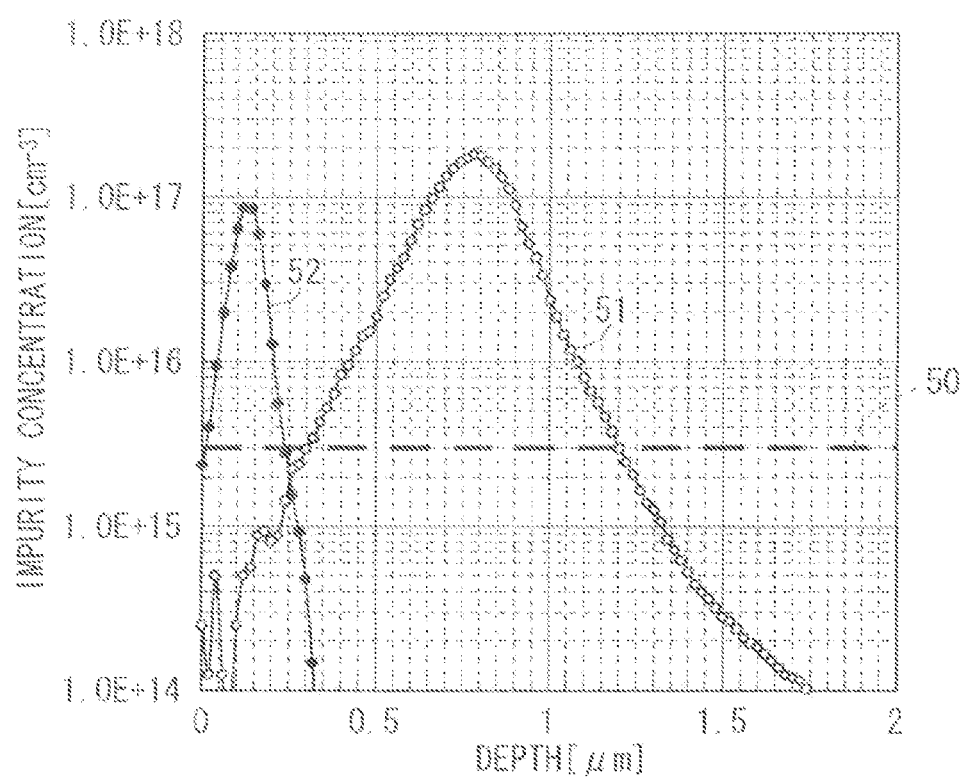
FIG. 6 is a chart showing an impurity profile of the present JTE structure C.

The combination of the JTE structure C according to the present application and the comparative JTE structure D will be hereinafter referred to as "JTE structures C and D" in some cases. FIGS. 5 and 6 are charts showing an impurity profile in the thickness direction of the substrate in the JTE structures C and D. FIG. 5 is a chart showing the impurity profile of the comparative JTE structure D, and FIG. 6 is a chart showing the impurity profile of the JTE structure C according to the present application. In FIGS. 5 and 6, an axis of abscissa indicates a depth from the substrate surface S0 (which will be hereinafter referred to as a "depth" in some cases) [µm] and an axis of ordinate indicates an impurity concentration [cm$^{-3}$].

In FIGS. 5 and 6, a concentration of the first conductivity type impurity of the SiC epitaxial layer 12 is indicated as the reference numeral "50", and a concentration of the second conductivity type impurity of the first JTE region 15 formed on the innermost side of the substrate in the three JTE regions 15 is indicated as the reference numeral "51". In FIG. 6, moreover, a concentration of the first conductivity type impurity of the first conductivity type region 16 is indicated as the reference numeral "52".

In the present simulation, each of the JTE regions 15 having the JTE structures C and D is formed by performing an ion implantation treatment with a single implantation energy as described above. Accordingly, a peak of the impurity concentration of the first JTE region 15 is formed in a deeper position than the substrate surface S0 as shown in FIGS. 5 and 6. More specifically, the peak of the impurity concentration of the first JTE region 15 is placed in a position having a depth of approximately 0.8 µm from the substrate surface S0.

As shown in FIG. 5, with the comparative JTE structure D, a concentration of the nitrogen (N) to be the n-type impurity of the SiC epitaxial layer 12 is higher in a depth of approximately 0.3 µm or less than a concentration of the aluminum (Al) to be the p-type impurity implanted for forming the JTE region 15. Accordingly, the first conductivity type SiC region having an impurity concentration which is equal to the impurity concentration of the SiC epitaxial layer 12 serving as the drift layer or is lower than the impurity concentration of the SiC epitaxial layer 12 is formed in a depth of approximately 0.3 µm at the substrate surface S0 side from the JTE region 15.

On the other hand, with the JTE structure C according to the present application, the first conductivity type SiC region 16 which apparently has a higher impurity concentration than that of the SiC epitaxial layer 12 serving as the drift layer is formed in a depth of approximately 0.3 µm at the substrate surface S0 side from the JTE region 15 as shown in FIG. 6.

Figure 7:
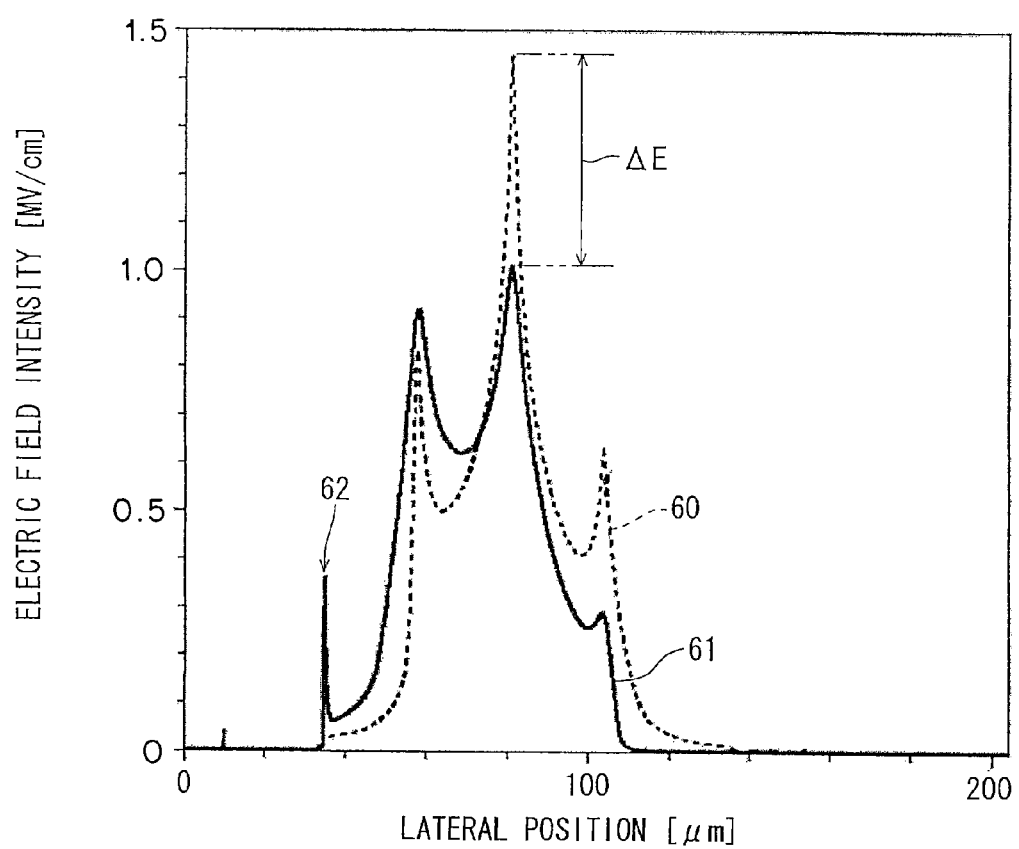
FIG. 7 is a graph showing a relationship between electric field intensities reaching substrate surfaces S0 in the two types of the JTE structures C and D and a lateral distance of a substrate.

There is supposed the case in which a comparatively high reverse voltage of 3300 V is applied to the pn diode in which these two types of the JTE structures C and D are formed. FIG. 7 is a graph showing a relationship between an electric field intensity reaching the substrate surface S0 in the two types of the JTE structures C and D and a lateral position of the substrate. In FIG. 7, an axis of abscissa indicates the lateral position [µm] of the substrate and an axis of ordinate indicates an electric field intensity [MV/cm]. The lateral position of the substrate indicates a position in the lateral direction of the substrate. A direction of the axis of abscissa in FIG. 7 corresponds to a transverse direction of the paper in FIG. 1.

In FIG. 7, a result of the comparative JTE structure D is indicated as the reference numeral "60" and a result of the JTE structure C according to the present application is indicated as the reference numeral "61". In FIG. 7, moreover, an end of the second conductivity type SiC region 13, that is, a portion provided in contact with the JTE region 15 is indicated as an arrow "62".

As shown in FIG. 7, it was found that the maximum value of the electric field intensity reaching the substrate surface S0 is 1.44 MV/cm in the comparative JTE structure D and is 1.02 MV/cm in the JTE structure C according to the present invention which is reduced by approximately 30%. In other words, a reduction amount ΔE of the maximum value of the electric field intensity reaching the substrate surface S0 which is obtained by change from the comparative JTE structure D to the JTE structure C according to the present application was approximately 30%. From the results described above, it is apparent that the following effects can be obtained.

With the JTE structure C according to the present application, as described above, the first conductivity type SiC region 16 having a higher impurity concentration than that of the SiC epitaxial layer 12 serving as the drift layer is formed in at least the vicinal portion of the surface of the junction portion between the JTE regions 15 at the substrate surface S0 side from the JTE region 15.

Depletion in the surface on one of the sides in the thickness direction of the JTE region 15 is suppressed by the first conductivity type SiC region 16. Therefore, a portion having the highest electric field intensity in the JTE region 15 can be positioned on the back side of the JTE region 15, more specifically, on the other side in the thickness direction of the JTE region 15 from the surface on one of the sides in the thickness direction. Consequently, it is possible to reduce the peak value of the electric field intensity which reaches the substrate surface S0. Thus, it is possible to suppress creeping discharge on the outside of the substrate. Accordingly, it is possible to prevent the drop in the withstand voltage of the semiconductor device 1. Consequently, it is possible to implement the semiconductor device 1 having a high withstand voltage in which a stable withstand voltage can be obtained.

Figure 17:
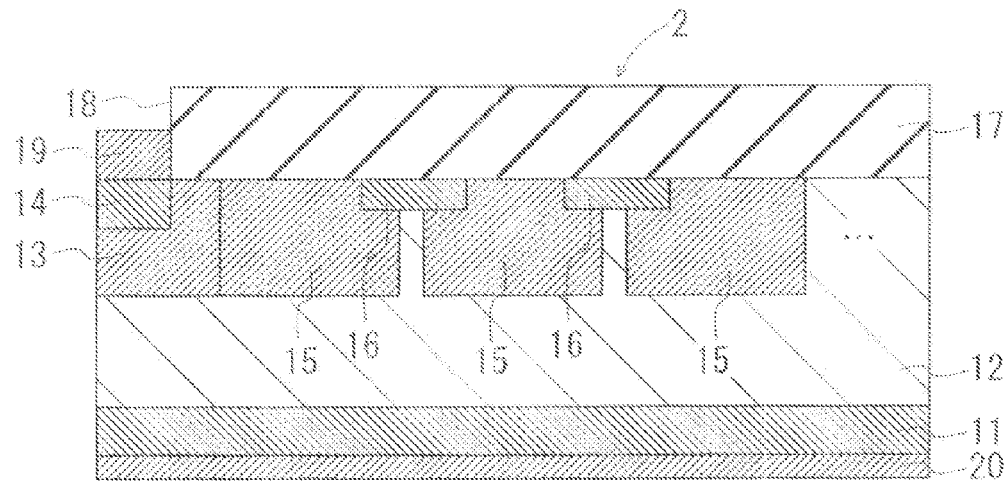
FIG. 17 is a sectional view showing a structure of a semiconductor device 2 according to a second embodiment of the present invention.

With the structure in which the first conductivity type SiC region 16 is positioned in only the vicinal portion of the surface of the junction portion between the JTE regions 15 as shown in FIG. 1, similarly, the effects of the first conductivity type SiC region 16 can be obtained. As shown in FIG. 17 which will be described below, moreover, the effects can be obtained also in the structure in which the first conductivity type SiC region 16 is positioned in only a vicinal portion of a surface of a junction portion between the JTE region 15 and the SiC epitaxial layer 12.

In other words, the effects of the first conductivity type SiC region 16 can be obtained if the first conductivity type SiC region 16 is formed in at least the vicinal portion of the surface of the junction portion between the JTE regions 15 or between the JTE region 15 and the SiC epitaxial layer 12 at the substrate surface S0 side from the JTE region 15.

Next, a method for manufacturing the semiconductor device 1 according to the first embodiment of the present invention will be described. FIGS. 8 to 13 are views for explaining the method for manufacturing the semiconductor device 1 according to the first embodiment of the present invention.

Figure 8:
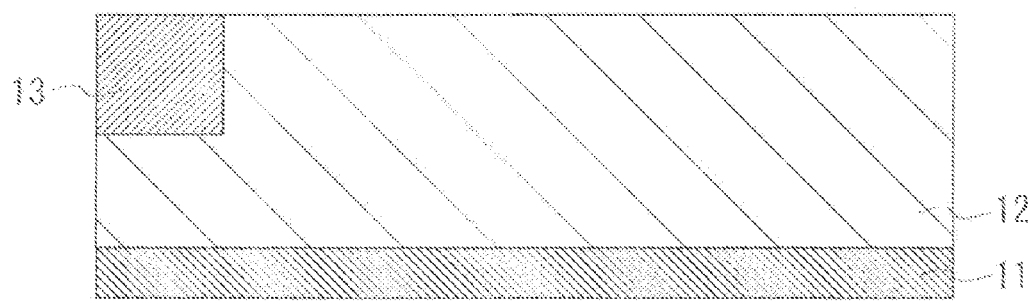
FIG. 8 is a sectional view showing a state of a stage in which formation of the second conductivity type SiC region 13 is ended.

FIG. 8 is a sectional view showing a state of a stage in which formation of the second conductivity type SiC region 13 is ended. First of all, an epitaxial growth treatment using a predetermined dopant is carried out over the surface at one of the sides in the thickness direction of the SiC substrate 11 having the first conductivity type. As shown in FIG. 8, consequently, the SiC epitaxial layer 12 having the first conductivity type is formed on the surface at one of the sides in the thickness direction of the SiC substrate 11. The step of forming the SiC epitaxial layer 12 corresponds to a silicon carbide layer forming step. In the present embodiment, the n-type SiC substrate 11 is used as the SiC substrate 11, and the impurity having the first conductivity type, more specifically, the n-type impurity is used as the predetermined dopant. For example, nitrogen (N), phosphorus (P) or the like is used as the n-type impurity.

Next, a treatment for implanting an ion of the predetermined dopant (which will be hereinafter referred to as an "ion implantation treatment" in some cases) is carried out over a region which is predetermined as a region for forming the second conductivity type SiC region 13 in the vicinal portion of the surface at one of the sides in the thickness direction of the SiC epitaxial layer 12. In the present embodiment, the ion implantation treatment is carried out in such a manner that the ion is implanted over the vicinity of a central part in the thickness direction of the SiC epitaxial layer 12 from the surface on one of the sides in the thickness direction. As shown in FIG. 8, consequently, the second conductivity type SiC region 13 having the second conductivity type is formed in a part of the vicinal portion of the surface on one of the sides in the thickness direction of the SiC epitaxial layer 12, more specifically, the predetermined region. The step of forming the second conductivity type SiC region 13 corresponds to a second conductivity type region forming step.

The ion implantation treatment in the present step of forming the second conductivity type SiC region 13 may be carried out in a single implantation energy or may be performed while the implantation energy is changed stepwise, for example, stepwise change is made from high energy to low energy. As the predetermined dopant to be used in the ion implantation treatment at the present step, moreover, the impurity having the second conductivity type, more specifically, the p-type impurity is used in the present embodiment. As the p-type impurity, aluminum (Al) or boron (B) is used, for example.

Figure 9:
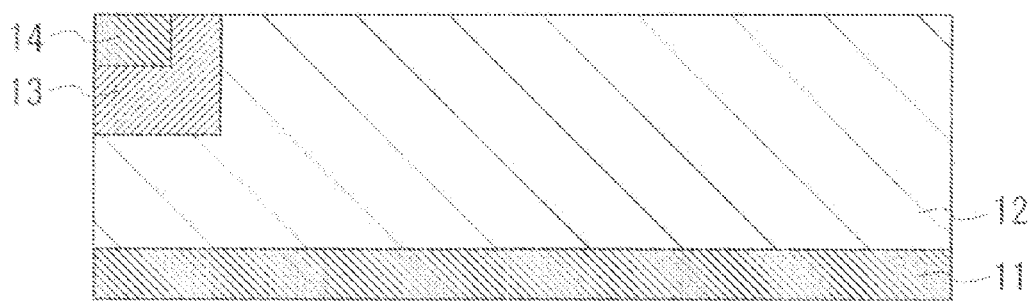
FIG. 9 is a sectional view showing a state of a stage in which formation of an ohmic contact region 14 is ended.

FIG. 9 is a sectional view showing a state of a stage in which formation of the ohmic contact region 14 is ended. After the second conductivity type SiC region 13 is formed, the ion implantation treatment is carried out over a region which is predetermined as a region for forming the ohmic contact region 14 in the region in which the second conductivity type SiC region 13 is formed. As shown in FIG. 9, consequently, the ohmic contact region 14 having a higher impurity concentration than the second conductivity type SiC region 13 and the second conductivity type is formed in the second conductivity type SiC region 13.

The ion implantation treatment in the present step of forming the ohmic contact region 14 may be carried out in a single implantation energy or may be performed while the implantation energy is changed stepwise, for example, stepwise change is made from a high energy to a low energy. As the predetermined dopant to be used in the ion implantation treatment at the present step, moreover, the p-type impurity is used in the present embodiment. As the p-type impurity, aluminum (Al) or boron (B) is used, for example.

Figure 10:
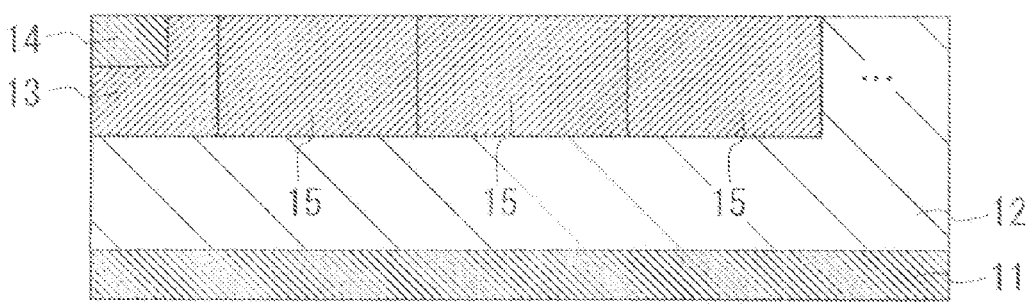
FIG. 10 is a sectional view showing a state of a stage in which formation of a JTE region 15 is ended.

FIG. 10 is a sectional view showing a state of a stage in which formation of the JTE region 15 is ended. After the ohmic contact region 14 is formed, the ion implantation treatment is carried out plural times with change in an implantation mask in an adjacent region to the second conductivity type SiC region 13 in the lateral direction of the substrate in the vicinal portion of the surface on one of the sides in the thickness direction of the SiC epitaxial layer 12. As shown in FIG. 10, consequently, there are formed the JTE regions 15 which are adjacent to the second conductivity type SiC region 13. The JTE regions 15 are formed side by side in the lateral direction.

The step of forming the JTE region 15 corresponds to a termination region forming step. Moreover, the adjacent region to the second conductivity type SiC region 13 in the lateral direction of the substrate corresponds to a portion on the outer peripheral end side of the SiC substrate 11 from the second conductivity type SiC region 13, that is, an adjacent region to the second conductivity type SiC region 13.

Each of the JTE regions 15 is formed to have the second conductivity type. Moreover, each of the JTE regions 15 is formed in such a manner that an impurity concentration thereof is lower than the impurity concentration of the second conductivity type SiC region 13. Furthermore, each of the JTE regions 15 is formed in such a manner that the impurity concentration has a concentration distribution for stepwise decrease from the second conductivity type SiC region 13 toward the SiC epitaxial layer 12 in the lateral direction, that is, from the inner side of the substrate toward the outermost edge side in the lateral direction. Differently from the present embodiment, each of the JTE regions 15 may be formed in such a manner that the impurity concentration has a uniform concentration distribution wholly in the lateral direction.

At the present step, moreover, the JTE regions 15 are formed in such a manner that the surface density of the second conductivity type impurity is decreased toward the outer peripheral end side of the SiC substrate 11 through regulation of the ion implantation amount in the ion implantation treatment. The ion implantation treatment in the present step of forming the JTE region 15 may be carried out in a single implantation energy or may be performed while the implantation energy is changed stepwise, for example, stepwise change is made from high energy to low energy.

In the ion implantation treatment, when the implantation energy is higher, the ion is implanted more deeply. In the case in which the ion implantation treatment is carried out in the single implantation energy, accordingly, it is possible to implement the impurity concentration distribution having an impurity concentration peak in a deeper position from the surface on one of the sides in the thickness direction of the SiC epitaxial layer 12 when the implantation energy is higher. By utilizing this fact, in the present embodiment, each of the JTE regions 15 is formed in such a manner that the ion implantation energy in the ion implantation treatment is regulated and the concentration of the second conductivity type impurity in each of the JTE regions 15 thus has a maximum value on the other side in the thickness direction of each of the JTE regions 15 from the surface on one of the sides in the thickness direction.

As the predetermined dopant to be used in the ion implantation treatment at the present step, the impurity having the second conductivity type, more specifically, the p-type impurity is used in the present embodiment. As the p-type impurity, aluminum (Al) or boron (B) is used, for example.

Figure 11:
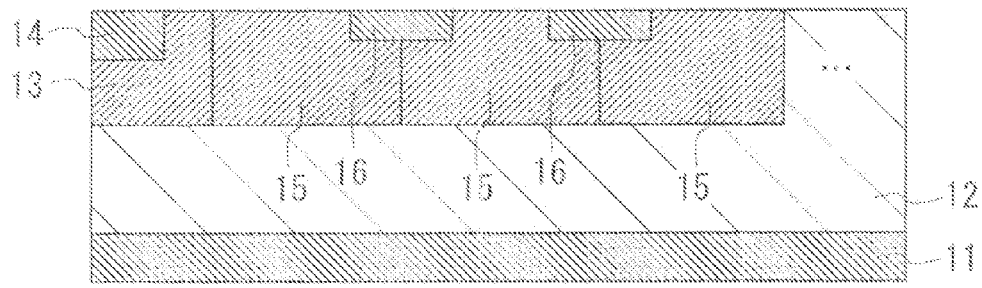
FIG. 11 is a sectional view showing a state of a stage in which formation of a first conductivity type SiC region 16 is ended.

FIG. 11 is a sectional view showing a state of a stage in which formation of the first conductivity type SiC region 16 is ended. After the JTE region 15 is formed, the ion implantation treatment is carried out over at least the vicinal portion of the surface on one of the sides in the thickness direction in the portion in which the JTE regions 15 are bonded to each other. In the present embodiment, the ion implantation treatment is carried out over the junction portion of the JTE regions 15 in the vicinal portion of the surface on one of the sides in the thickness direction of the portion in which the JTE regions 15 are bonded to each other, that is, the vicinal portion of the surface on one of the sides in the thickness direction of the JTE region 15. As shown in FIG. 11, consequently, the first conductivity type SiC region 16 is formed in the junction portion of the JTE regions 15 in the vicinal portion of the surface on one of the sides in the thickness direction of the JTE region 15. The first conductivity type SiC region 16 is formed to reach a depth which is one-third (⅓) of the thickness of the JTE region 15 from the surface on one of the sides in the thickness direction of the JTE region 15, for example. The step of forming the first conductivity type SiC region 16 corresponds to a first conductivity type region forming step.

At the present step of forming the first conductivity type SiC region 16, it is possible to form the first conductivity type SiC region 16 down to a depth which does not reach a bottom part of the JTE region 15 from the surface on one of the sides in the thickness direction of the SiC epitaxial layer 12, more specifically, the surface on one of the sides in the thickness direction of the JTE region 15 by regulating the implantation energy in the ion implantation treatment. As shown in FIG. 11, consequently, it is possible to obtain a structure in which the first conductivity type SiC region 16 is present in the vicinal portion of the surface on one of the sides in the thickness direction in the junction portion of the JTE regions 15, and furthermore, the second conductivity type SiC region 13 is formed into a deeper position than the first conductivity type SiC region 16 from the surface on one of the sides in the thickness direction of the SiC epitaxial layer 12.

After each of the ion implantation treatments described above, an activation annealing treatment is carried out. Consequently, each impurity subjected to the ion implantation at each of the steps can be activated electrically. By the activation annealing treatment, moreover, it is possible to recover a crystallinity of the ion implantation region at the same time.

Figure 12:
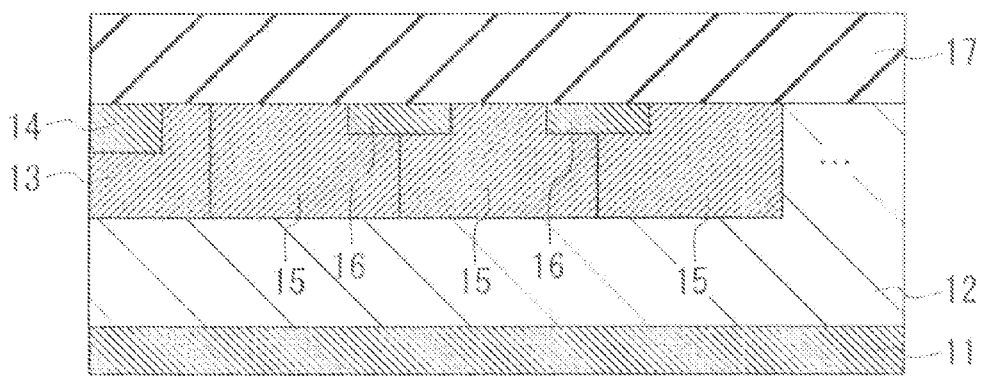
FIG. 12 is a sectional view showing a state of a stage in which formation of a protective film 17 is ended.

FIG. 12 is a sectional view showing a state of a stage in which formation of the protective film 17 is ended. After the first conductivity type SiC region 16 is formed, the protective film 17 is formed on the surface at one of the sides in the thickness direction of the SiC epitaxial layer 12 as shown in FIG. 12. The protective film 7 is implemented by an insulating film constituted by an insulating material such as $SiO_2$ or polyimide.

Figure 13:
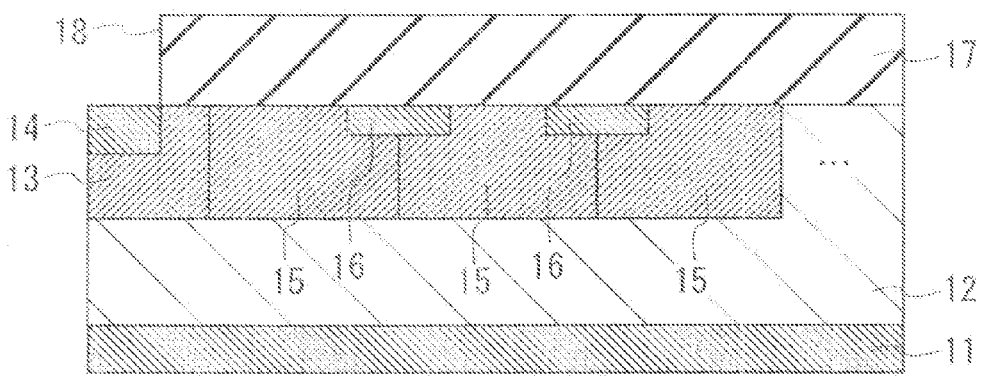
FIG. 13 is a sectional view showing a state of a stage in which formation of an opening portion 18 is ended.

FIG. 13 is a sectional view showing a state of a stage in which formation of the opening portion 18 is ended. After the protective film 17 is formed, the opening portion 18 is formed on the protective film 17 as shown in FIG. 13. The opening portion 18 is formed in such a manner that the ohmic contact region 14 is exposed from a bottom part of the opening portion 18 as shown in FIG. 13.

After the opening portion 18 is formed, the anode electrode 19 shown in FIG. 1 is formed so as to be electrically connected to the ohmic contact region 14 exposed from the bottom part of the opening portion 18. Moreover, the cathode electrode 20 shown in FIG. 1 is formed on a surface at the other side in the thickness direction of the SiC substrate 11.

Through the steps described above, there is obtained the semiconductor device 1 according to the first embodiment of the present invention shown in FIG. 1. In the present embodiment, it is possible to obtain the semiconductor device 1 in which the first conductivity type SiC region 16 is present in the vicinal portion of the surface on one of the sides in the thickness direction in the portion in which the JTE regions 15 are bonded to each other, and furthermore, the second conductivity type SiC region 13 is present in the deeper position than the first conductivity type SiC region 16 from the surface on one of the sides in the thickness direction of the SiC epitaxial layer 12.

The semiconductor device 1 having the structure can reduce the peak value of the electric field intensity which reaches the surface on one of the sides in the thickness direction of the SiC epitaxial layer 12 also in the case in which the electric field concentrates on the junction portion of the adjacent JTE regions 15 so that the peak of the electric field intensity is generated when the comparatively high reverse voltage is applied to the pn junction as described above. According to the method for manufacturing a semiconductor device according to the present embodiment, therefore, it is possible to provide the semiconductor device 1 having a high withstand voltage in which a stable withstand voltage can be obtained.

In the present embodiment, moreover, the implantation energy in the ion implantation treatment is regulated to adjust the distribution of the impurity concentration of the JTE region 15. Accordingly, by setting the ion implantation energy into one type, for example, it is possible to easily manufacture the semiconductor device 1 having a high withstand voltage in which a stable withstand voltage can be obtained as described above.

Although the JTE region 15 is formed by the ion implantation treatment, and then, the ion implantation treatment is further carried out to form the first conductivity type SiC region 16 as shown in FIGS. 10 and 11 in the present embodiment described above, the first conductivity type SiC region may be formed by another forming method.

Figure 14:
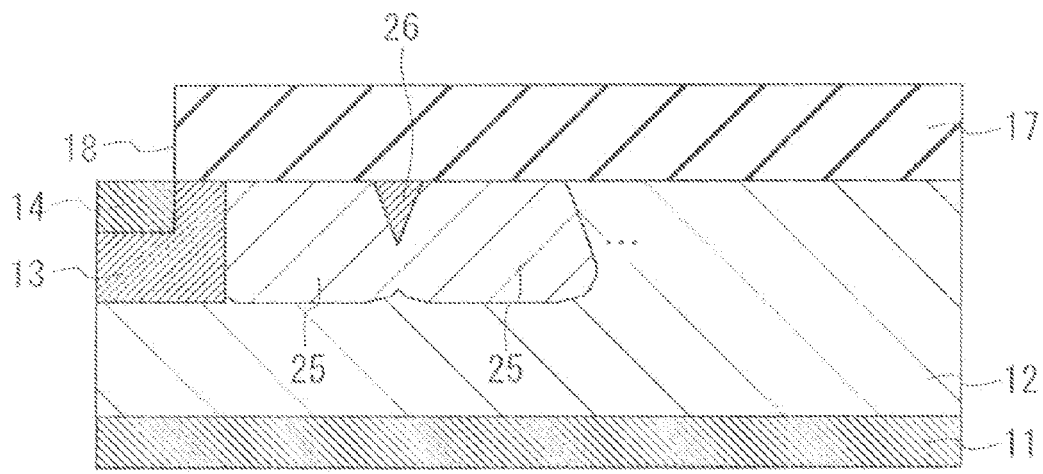
FIG. 14 is a sectional view showing another example of the first conductivity type SiC region.

FIG. 14 is a sectional view showing another example of the first conductivity type SiC region. FIG. 14 shows a state of a stage in which formation of a first conductivity type SiC region 26 according to another example of the first conductivity type SiC region is ended. As shown in FIG. 14, the first conductivity type SiC region 26 may be formed by using a lateral spreading effect in the ion implantation for forming a JTE region 25.

In this case, in the ion implantation treatment for forming the JTE region 25, the position in which the ion is to be implanted is adjusted to couple the adjacent JTE regions 25 in a deeper position than the surface on one of sides in the thickness direction of the SiC epitaxial layer 12 by using the lateral spreading effect in the ion implantation. Consequently, a portion in which the JTE regions 25 are not coupled to each other is formed in the vicinal portion of the surface on one of the sides in the thickness direction of the SiC epitaxial layer 12. The portion in which the JTE regions 25 are not coupled to each other, that is, the SiC epitaxial layer 12 which is left between the JTE regions 25 provided apart from each other serves as the first conductivity type SiC region 26.

Herein, the JTE region 25 corresponds to a junction termination region. The first conductivity type SiC region 26 corresponds to a first conductivity type region. With the structure shown in FIG. 14, similarly, it is possible to obtain the same effects as those in the present embodiment.

Although the first conductivity type SiC region 26 is shown in different hatching from the SiC epitaxial layer 12 in FIG. 14, they are actually identical to each other. As described above, the SiC epitaxial layer 12 left between the JTE regions 25 after the ion implantation treatment for forming the JTE region 25 serves as the first conductivity type SiC region 26.

By thus forming the first conductivity type SiC region 26 using the lateral spreading effect in the ion implantation for forming the JTE region 25, it is possible to omit the step of the ion implantation treatment for forming the first conductivity type SiC region 26. Accordingly, the semiconductor device having a high withstand voltage in which a stable withstand voltage can be obtained as described above can be manufactured further easily and inexpensively as compared with the present embodiment.

Moreover, the adjacent JTE regions 25 may be coupled to each other in the deeper position than the surface on one of the sides in the thickness direction of the SiC epitaxial layer 12 to form the first conductivity type SiC region 26 by another method. As another method, for example, it is possible to use a method for tapering a resist serving as an implantation mask or a method for carrying out the ion implantation treatment over the SiC substrate 11 in an oblique direction. Also in the case in which the first conductivity type SiC region 26 is thus formed, it is possible to obtain the same effects as those in the present embodiment.

In the present embodiment, furthermore, the ion implantation treatment is carried out over the SiC epitaxial layer 12 in order to form the JTE region 15. In the ion implantation treatment for forming the JTE region 15, it is desirable to carry out the ion implantation treatment in such a manner that an average value of the implantation surface density over the whole termination implantation region constituted by the adjacent JTE regions 15 to the second conductivity type SiC region 13 is $0.5 \times 10^{13}/cm^2$ to $3 \times 10^{13}/cm^2$. The implantation surface density is equal to an integral of a volume impurity density over the thickness of the impurity region. In the case in which the volume impurity concentration is constant over the thickness of the impurity region, the implantation surface density is equal to a product of the volume impurity concentration and the thickness of the impurity region.

In the present embodiment, a thickness of each of the JTE regions 15, that is, a depth from the surface on one of the sides in the thickness direction of the SiC epitaxial layer 12 is approximately 0.6 μm to 1.0 μm. Moreover, an implantation width of each of the JTE regions 15 is approximately 30 μm to 300 μm. An impurity concentration of the first conductivity type SiC region 16 is approximately $10^{16}/cm^3$ to $10^{17}/cm^3$, and a thickness thereof, that is, a depth from the surface on one of the sides in the thickness direction of the SiC epitaxial layer 12 is approximately 0.1 μm to 0.3 μm.

In the present embodiment, furthermore, the description has been given to the case in which the semiconductor device 1 is the pn diode. However, the present invention is not restricted to the pn diode but the structure of the semiconductor device 1 according to the present embodiment can be applied to any termination structure having the JTE region 15. For example, it is also possible to apply the structure of the semiconductor device 1 according to the present embodiment to a Schottky diode using SiC, an MOSFET using SiC, an insulated gate bipolar transistor (abbreviation: IGBT) using SiC or the like.

More specific description will be given. In the present embodiment, an implantation profile for forming the JTE region 15 is taken in such a manner that the impurity concentration in the vicinal portion of the surface on one of the sides in the thickness direction of the JTE region 15 is lower than the implantation peak. The first conductivity type SiC region 16 is present in the vicinal portion of the surface on one of the sides in the thickness direction of the junction portion between the JTE regions 15. Moreover, the second conductivity type SiC region 13 is present from the surface on one of the sides in the thickness direction of the SiC epitaxial layer 12 to the deeper position than the first conductivity type SiC region 16. Such a structure can also be applied to a semiconductor device using SiC having the JTE region 15, for example, a Schottky diode, an MOSFET, an IGBT or the like.

Although the description has been given to the structure in which the first conductivity type SiC region 16 is positioned in only the vicinal portion of the surface of the junction portion between the adjacent JTE regions 15 in the present embodiment, moreover, the first conductivity type SiC region may have another structure.

Figure 16:
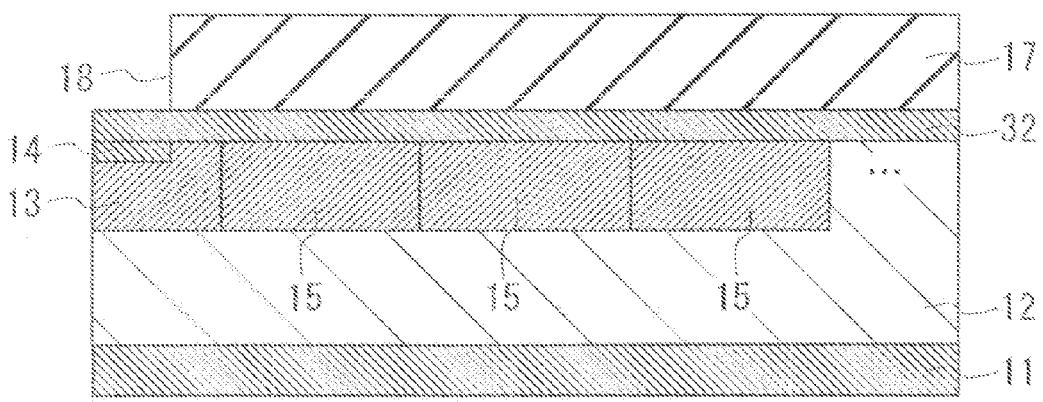
FIG. 16 is a sectional view showing a further example of the first conductivity type SiC region.

FIGS. 15 and 16 are sectional views showing another example of the first conductivity type SiC region. FIGS. 15 and 16 show a state of a stage in which formation of first conductivity type SiC regions 31 and 32 according to another example of the first conductivity type SiC region is ended. The first conductivity type SiC regions 31 and 32 correspond to the first conductivity type region.

The first conductivity type SiC region may be formed over the whole vicinal portion of the surface on one of the sides in the thickness direction of the termination region constituted by the JTE regions 15 in the same manner as the first conductivity type SiC region 31 shown in FIG. 15. Moreover, the first conductivity type SiC region may be formed over the whole vicinal portion of the surface on one of the sides in the thickness direction of the device including the second conductivity type SiC region 13 and the ohmic contact region 14 in addition to the termination region in the same manner as the first conductivity type SiC region 32 shown in FIG. 16. With the structures shown in FIGS. 15 and 16, similarly, it is possible to obtain the same effects as those in the present embodiment.

Second Embodiment

FIG. 17 is a sectional view showing a structure of a semiconductor device 2 according to a second embodiment of the present invention. The semiconductor device 2 according to the present embodiment has a similar structure to the structure of the semiconductor device 1 according to the first embodiment. In the present embodiment, accordingly, different portions from the semiconductor device 1 according to the first embodiment will be described, corresponding portions to the semiconductor device 1 have the same reference numerals, and common explanation will be omitted. Also in the present embodiment, a first conductivity type is set to be an n type and a second conductivity type is set to be a p type in the same manner as in the first embodiment.

The semiconductor device 2 according to the present embodiment is a pn diode in the same manner as the semiconductor device 1 according to the first embodiment. In the same manner as the semiconductor device 1 according to the first embodiment, the semiconductor device 2 according to the present embodiment is constituted to include a silicon carbide (SiC) substrate 11, an SiC epitaxial layer 12, a second conductivity type SiC region 13, an ohmic contact region 14, a JTE region 15, a first conductivity type SiC region 16, a protective film 17, an anode electrode 19 and a cathode electrode 20.

Referring to the semiconductor device 1 according to the first embodiment, as shown in FIG. 1, the JTE regions 15 are provided adjacently to each other in the lateral direction toward the outermost edge of the semiconductor device 1. On the other hand, in the semiconductor device 2 according to the present embodiment, the JTE regions 15 are provided at a predetermined interval in a lateral direction toward an outermost edge of the semiconductor device 2 respectively as shown in FIG. 17. In other words, the JTE regions 15 are provided apart from each other in non-contact with each other. The SiC epitaxial layer 12 is provided between the adjacent JTE regions 15.

The first conductivity type SiC region 16 is formed in a vicinal portion of a surface on one of sides in a thickness direction of the JTE region 15 and the SiC epitaxial layer 12 in a junction portion of the JTE region 15 and the SiC epitaxial layer 12.

Next, a method for manufacturing the semiconductor device 2 according to the second embodiment of the present invention will be described below. FIGS. 18 to 21 are views for explaining the method for manufacturing the semiconductor device 2 according to the second embodiment of the present invention.

First of all, as shown in FIG. 8 described above, the SiC epitaxial layer 12 having the first conductivity type is formed on a surface at one of sides in a thickness direction of the SiC substrate 11 having the first conductivity type in the same manner as in the first embodiment. Next, the second conductivity type SiC region 13 having the second conductivity type is formed in a region predetermined as a region in which the second conductivity type SiC region 13 is to be formed in the vicinal portion of the surface on one of the sides in the thickness direction of the SiC epitaxial layer 12. Subsequently, the ohmic contact region 14 having a higher impurity concentration than the second conductivity type SiC region 13 and the second conductivity type is formed in a region predetermined as a region in which the ohmic contact region 14 is to be formed in the vicinal portion of the surface on one of the sides in the thickness direction of the region in which the second conductivity type SiC region 13 is formed.

Figure 18:
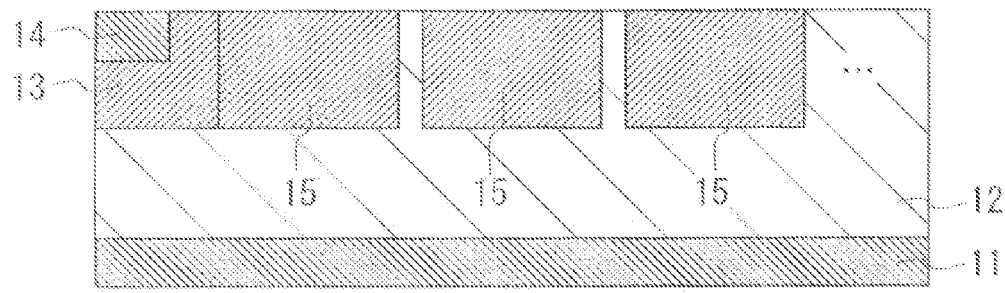
FIG. 18 is a sectional view showing a state of a stage in which formation of a JTE region 15 is ended.

FIG. 18 is a sectional view showing a state of a stage in which formation of the JTE region 15 is ended. After the ohmic contact region 14 is formed, an ion implantation treatment is carried out plural times with an implantation mask changed to form the JTE regions 15 in adjacent regions in the lateral direction of the second conductivity type SiC region 13. In the present embodiment, the JTE regions 15 are formed at a predetermined interval toward the outermost edge. In other words, the JTE regions 15 are formed apart from each other in such a manner that the SiC epitaxial layer 12 is provided between the adjacent JTE regions 15. The step of forming the JTE region 15 corresponds to a termination region forming step.

Each of the JTE regions 15 is formed to have the second conductivity type. Each of the JTE regions 15 is formed in such a manner that an impurity concentration thereof is lower than the impurity concentration of the second conductivity type SiC region 13. Furthermore, each of the JTE regions 15 is formed to have a concentration distribution for stepwise decrease from the second conductivity type SiC region 13 toward the SiC epitaxial layer 12, that is, from an inner part of a substrate toward the outermost edge in the lateral direction. Differently from the present embodiment, the JTE region 15 may be formed to have a uniform concentration distribution.

In the same manner as in the first embodiment, moreover, an ion implantation treatment at the present step of forming the JTE region 15 may be carried out in a single implantation energy or may be performed while the implantation energy is changed stepwise, for example, stepwise change is made from high energy to low energy. In the ion implantation treatment, when the implantation energy is higher, an ion is implanted more deeply. In the case in which the ion implantation treatment is carried out in the single implantation energy, accordingly, it is possible to implement the impurity concentration distribution having an impurity concentration peak in a deeper position from the surface on one of the sides in the thickness direction of the SiC epitaxial layer 12 when the implantation energy is higher.

Figure 19:
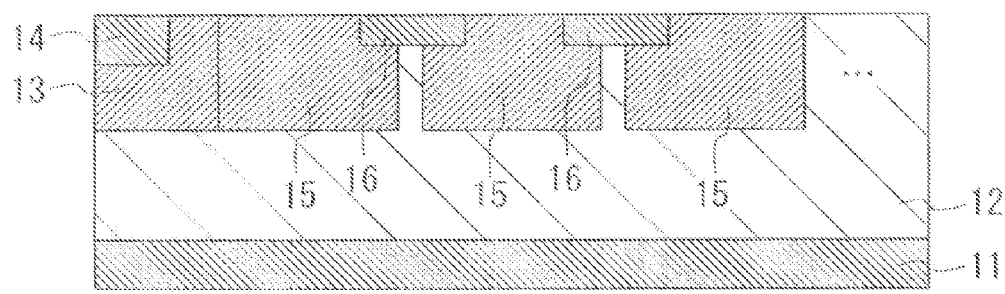
FIG. 19 is a sectional view showing a state of a stage in which formation of a first conductivity type SiC region 16 is ended.

FIG. 19 is a sectional view showing a state of a stage in which formation of the first conductivity type SiC region 16 is ended. After the JTE region 15 is formed, the ion implantation treatment is carried out over a portion in which the JTE region 15 and the SiC epitaxial layer 12 are bonded to each other in at least the vicinal portion of the surface on one of the sides in the thickness direction of the JTE region 15 and the SiC epitaxial layer 12. In the present embodiment, the ion implantation treatment is carried out over the portion in which the JTE region 15 and the SiC epitaxial layer 12 are bonded to each other in the vicinal portion of the surface on one of the sides in the thickness direction of the JTE region 15 and the SiC epitaxial layer 12.

As shown in FIG. 19, consequently, the first conductivity type SiC region 16 is formed in the portion in which the JTE region 15 and the SiC epitaxial layer 12 are bonded to each other in the vicinal portion of the surface on one of the sides in the thickness direction of the JTE region 15 and the SiC epitaxial layer 12. The first conductivity type SiC region 16 is formed to reach a depth which is one-third ($\frac{1}{3}$) of the thickness of the JTE region 15 from the surface on one of the sides in the thickness direction of the JTE region 15 and the SiC epitaxial layer 12, for example. The step of forming the first conductivity type SiC region 16 corresponds to a first conductivity type region forming step.

At the present step of forming the first conductivity type SiC region 16, it is possible to form the first conductivity type SiC region 16 down to a depth which does not reach a bottom part of the JTE region 15 from the surface on one of the sides in the thickness direction of the SiC epitaxial layer 12, more specifically, the surface on one of the sides in the thickness direction of the JTE region 15 by regulating the implantation energy in the ion implantation treatment. As shown in FIG. 19, consequently, it is possible to obtain a structure in which the first conductivity type SiC region 16 is present in the vicinal portion of the surface on one of the sides in the thickness direction in the portion in which the JTE region 15 and the SiC epitaxial layer 12 are bonded to each other, and furthermore, the second conductivity type SiC region 13 is formed into a deeper position than the first conductivity type SiC region 16 from the surface on one of the sides in the thickness direction of the SiC epitaxial layer 12.

After each of the ion implantation treatments described above, an activation annealing treatment is carried out in the same manner as in the first embodiment. Consequently, each impurity subjected to the ion implantation at each of the steps can be activated electrically. By the activation annealing treatment, moreover, it is possible to recover a crystallinity of an ion implantation region at the same time.

Figure 20:
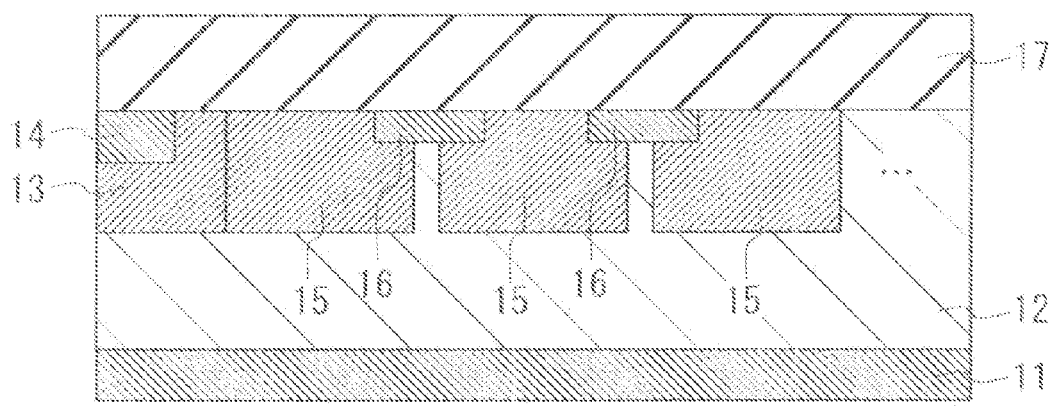
FIG. 20 is a sectional view showing a state of a stage in which formation of a protective film 17 is ended.

FIG. 20 is a sectional view showing a state of a stage in which formation of the protective film 17 is ended. After the first conductivity type SiC region 16 is formed, the protective film 17 is formed on the surface at one of the sides in the thickness direction of the SiC epitaxial layer 12 as shown in FIG. 20 in the same manner as in the first embodiment. The protective film 17 is implemented by an insulating film constituted by an insulating material such as $SiO_2$ or polyimide.

Figure 21:
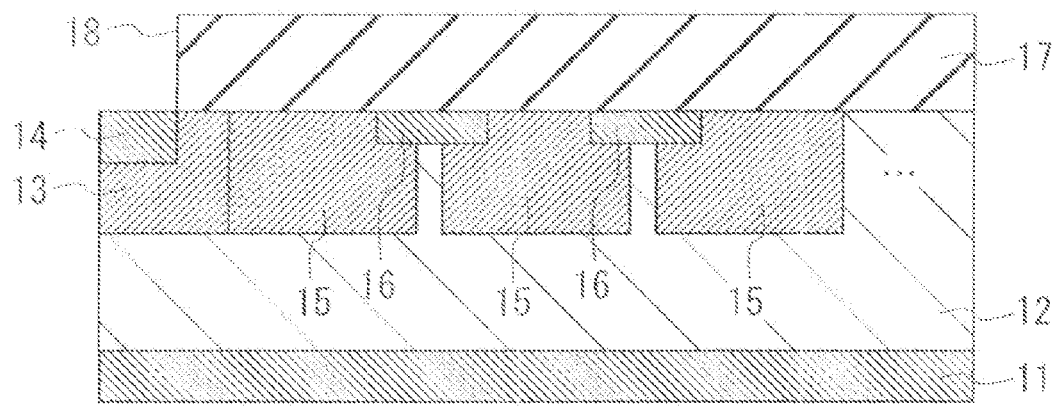
FIG. 21 is a sectional view showing a state of a stage in which formation of an opening portion 18 is ended.

FIG. 21 is a sectional view showing a state of a stage in which formation of an opening portion 18 is ended. After the protective film 17 is formed, the opening portion 18 is formed on the protective film 17 as shown in FIG. 21. The opening portion 18 is formed in such a manner that the ohmic contact region 14 is exposed from a bottom part of the opening portion 18 as shown in FIG. 21.

After the opening portion 18 is formed, the anode electrode 19 shown in FIG. 17 is formed so as to be electrically connected to the ohmic contact region 14 exposed from the bottom part of the opening portion 18 in the same manner as in the first embodiment. Moreover, the cathode electrode 20 shown in FIG. 17 is formed on a surface at the other side in the thickness direction of the SiC substrate 11.

Through the steps described above, there is obtained the semiconductor device 2 according to the second embodiment of the present invention. In the present embodiment, it is possible to obtain the semiconductor device 2 in which the first conductivity type SiC region 16 is present in the vicinal portion of the surface on one of the sides in the thickness direction in the junction portion of the JTE region 15 and the SiC epitaxial layer 12, and furthermore, the second conductivity type SiC region 13 is present in a deeper position than the first conductivity type SiC region 16 from the surface on one of the sides in the thickness direction of the SiC epitaxial layer 12.

Also in the semiconductor device 2 according to the present embodiment, accordingly, it is possible to obtain the same effects as those described in the first embodiment. In other words, it is possible to reduce a peak value of an electric field intensity which reaches the surface on one of the sides in the thickness direction of the SiC epitaxial layer 12 also in the case in which the electric field concentrates on the portion in which the JTE region 15 and the SiC epitaxial layer 12 are bonded to each other so that the peak of the electric field intensity is generated when a comparatively high reverse voltage is applied to a pn junction. Therefore, it is possible to provide the semiconductor device 2 having a high withstand voltage in which a stable withstand voltage can be obtained.

In the present embodiment, the description has been given to the case in which the semiconductor device 2 is the pn diode. However, the present invention is not restricted to the pn diode but the structure of the semiconductor device 2 according to the present embodiment can be applied to any termination structure having the JTE region 15. For example, it is possible to apply the structure according to the present embodiment to a Schottky diode using SiC, an MOSFET using SiC, an IGBT using SiC or the like.

In other words, it is also possible to apply, to the Schottky diode using the SiC, the MOSFET using the SiC, the IGBT using the SiC or the like which has the JTE region 15, the structure in which an implantation profile for forming the JTE region 15 is taken in such a manner that the impurity concentration in the vicinal portion of the surface on one of the sides in the thickness direction of the JTE region 15 is lower than the implantation peak, the first conductivity type SiC region 16 is present in the vicinal portion of the surface on one of the sides in the thickness direction of the junction portion of the JTE region 15 and the SiC epitaxial layer 12, and the second conductivity type SiC region 13 is present from the surface on one of the sides in the thickness direction of the SiC epitaxial layer 12 to the deeper position than the first conductivity type SiC region 16.

By thus applying the structure according to the present embodiment, it is possible to obtain the same effects as those in the present embodiment.

Although the description has been given to the structure in which the first conductivity type SiC region 16 is positioned in only the vicinal portion of the surface of the junction portion of the JTE region 15 and the SiC epitaxial layer 12 in the present embodiment, moreover, another structure may be employed.

Figure 22:
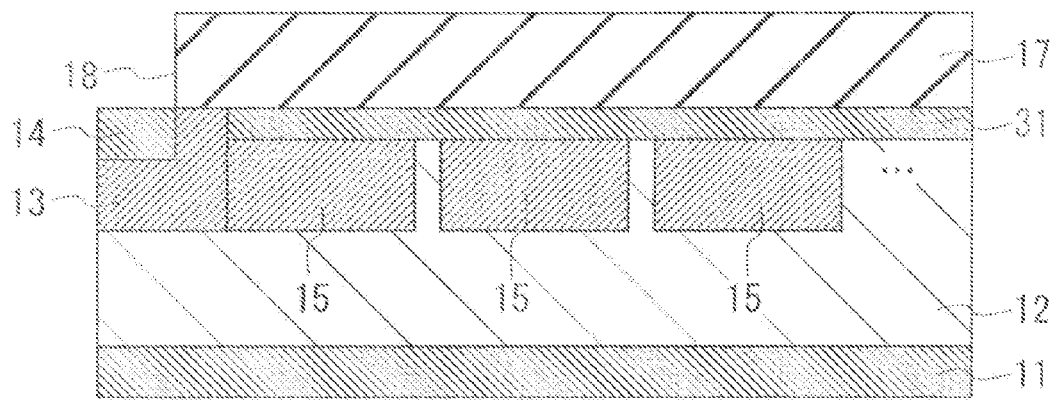
FIG. 22 is a sectional view showing another example of the first conductivity type SiC region.

FIGS. 22 and 23 are sectional views showing another example of the first conductivity type SiC region. FIGS. 22 and 23 show a state of a stage in which formation of first conductivity type SiC regions 31 and 32 serving as the first conductivity type SiC regions is ended.

The first conductivity type SiC region may be formed over the whole vicinal portion of the surface on one of the sides in the thickness direction of the termination region constituted by the JTE regions 15 in the same manner as the first conductivity type SiC region 31 shown in FIG. 22. Moreover, the first conductivity type SiC region may be formed over the whole vicinal portion of the surface in the device including the second conductivity type SiC region 13 and the ohmic contact region 14 shown in FIG. 23. With the structures shown in FIGS. 22 and 23, similarly, it is possible to obtain the same effects as those in the present embodiment.

In the first and second embodiments described above, each of the JTE regions 15 and 25 has the concentration of the second conductivity type impurity which is lower than the second conductivity type SiC region 13. Consequently, it is possible to reduce the electric field intensities in the JTE regions 15 and 25. Therefore, it is possible to suppress creeping discharge on the outside of the substrate more reliably. Accordingly, it is possible to prevent a drop in the withstand voltage of the semiconductor device more reliably.

In the first and second embodiments, furthermore, the JTE regions 15 and 25 are disposed in such a manner that the concentration of the second conductivity type impurity is decreased from the inner side of the substrate toward the outermost edge side in the lateral direction. Consequently, the electric field intensities of the JTE regions 15 and 25 can be reduced gradually toward the outermost edge side of the substrate. Therefore, it is possible to suppress the creeping discharge on the outside of the substrate further reliably. Accordingly, it is possible to prevent the drop in the withstand voltage of the semiconductor device further reliably.

Each of the JTE regions 15 and 25 may be formed in such a manner that the concentration of the second conductivity type impurity is equal to that of the second conductivity type SiC region 13. Consequently, it is possible to form the second conductivity type SiC region 13 and the JTE regions 15 and 25 at the same step. Therefore, it is possible to easily manufacture the semiconductor device having a high withstand voltage in which a stable withstand voltage can be obtained as described above.

In the first and second embodiments, moreover, the inner JTE regions 15 and 25 to be formed on the innermost side of the substrate in the lateral direction in the JTE regions 15 and 25 are provided adjacently to the second conductivity type SiC region 13 in the lateral direction. The present invention is not restricted to the structure but the inner JTE regions 15 and 25 may be formed apart from the second conductivity type SiC region 13 in the lateral direction. In other words, the inner JTE regions 15 and 25 and the second conductivity type SiC region 13 may be formed apart from each other in the lateral direction. Also in the case of the structure, it is possible to obtain the same effects as those in the first and second embodiments.

Although the first conductivity type is set to be the n type and the second conductivity type is set to be the p type in the first and second embodiments, moreover, the first conductivity type may be set to be the p type and the second conductivity type may be set to be the n type. In this case, the SiC substrate 11, the SiC epitaxial layer 12 and the first conductivity type SiC region 16 have the p-type conductivity and the second conductivity type SiC region 13, the ohmic contact region 14 and the JTE region 15 have the n-type conductivity.

While the invention has been shown and described in detail, the foregoing description is in all aspects illustrative and not restrictive. It is therefore understood that numerous modifications and variations can be devised without departing from the scope of the invention.

EXPLANATION OF DESIGNATIONS 1, 2 semiconductor device, 11 silicon carbide (SiC) substrate, 12 SiC epitaxial layer, 13 second conductivity type SiC region, 14 ohmic contact region, 15, 25 JTE region, 16, 26, 31, 32 first conductivity type SiC region, 17 protective film, 18 opening portion, 19 anode electrode, 20 cathode electrode.

The invention claimed is:

1. A semiconductor device comprising:
a silicon carbide substrate having a first conductivity type;
a silicon carbide layer provided on a surface at one of sides in a thickness direction of said silicon carbide substrate and having the first conductivity type;
a second conductivity type region formed in a part of a vicinal portion of a surface on one of sides in a thickness direction of said silicon carbide layer and having a second conductivity type; and
a plurality of junction termination regions formed in a portion on an outer peripheral end side of said silicon carbide substrate from said second conductivity type region in the vicinal portion of the surface at one of the sides in the thickness direction of said silicon carbide layer and having the second conductivity type,
wherein said plurality of junction termination regions are formed adjacently to each other or apart from each other in at least the surface on one of the sides in the thickness direction of said silicon carbide layer,
a first conductivity type region having the first conductivity type and a higher concentration of an impurity having the first conductivity type than that of said silicon carbide layer is formed in at least a vicinal portion of a surface on one of sides in a thickness direction of a portion in which said junction termination regions are bonded to each other or a portion provided between said junction termination regions which are disposed apart from each other, and
said first conductivity type region is formed across said junction termination regions which are adjacent to each other.

2. The semiconductor device according to claim 1, wherein each of said junction termination regions has a concentration of an impurity having the second conductivity type which is equal to that of said second conductivity region.

3. The semiconductor device according to claim 1, wherein each of said junction termination regions has a concentration of an impurity having said second conductivity type which is lower than that of said second conductivity type region.

4. The semiconductor device according to claim 1, wherein said junction termination regions are disposed in such a manner that a concentration of an impurity having said second conductivity type is decreased gradually toward the outer peripheral end side of said silicon carbide substrate.

5. The semiconductor device according to claim 1, wherein a concentration of an impurity having said second conductivity type in each of said junction termination regions has a maximum value at the other side in the thickness direction than that of the surface on one of the sides in the thickness direction.

6. The semiconductor device according to claim 5, wherein each of said junction termination regions has said concentration of the impurity having the second conductivity type in the surface on one of the sides in the thickness direction which is equal to or lower than one-tenth of said maximum value.

7. A method for manufacturing a semiconductor device comprising:
a silicon carbide layer forming step of forming a silicon carbide layer having a first conductivity type over a surface at one of sides in a thickness direction of a silicon carbide substrate having the first conductivity type;
a second conductivity type region forming step of forming a second conductivity type region having a second conductivity type in a part of a vicinal portion of a surface on one of sides in a thickness direction of said silicon carbide layer;
a termination region forming step of carrying out an ion implantation treatment over a portion on an outer peripheral end side of said silicon carbide substrate from said second conductivity type region in the vicinal portion of the surface at one of the sides in the thickness direction of said silicon carbide layer, thereby forming a plurality of junction termination regions having the second conductivity type adjacently to each other or apart from each other in at least the surface on one of the sides in the thickness direction of said silicon carbide layer; and
a first conductivity type region forming step of carrying out an ion implantation treatment in at least a vicinal portion of a surface on one of sides in a thickness direction of a portion in which said junction termination regions are bonded to each other or a portion provided between said junction termination regions which are disposed apart from each other, thereby forming a first conductivity type region having the first conductivity type and a higher concentration of an impurity having the first conductivity type than that of said silicon carbide layer,
wherein at said first conductivity type region forming step, said first conductivity type region is formed across said junction termination regions which are adjacent to each other.

8. The method for manufacturing a semiconductor device according to claim 7, wherein at said termination region forming step, an ion implantation amount in said ion implantation treatment is regulated to form said junction termination regions in such a manner that a concentration of an impurity having the second conductivity type in said junction termination regions is decreased gradually toward the outer peripheral end side of said silicon carbide substrate.

9. The method for manufacturing a semiconductor device according to claim 7, wherein at said termination region forming step, an ion implantation amount in said ion implantation treatment is regulated to form each of said junction termination regions in such a manner that a concentration of an impurity having the second conductivity type in each of said junction termination regions has a maximum value on the other side in the thickness direction of said silicon carbide layer from the surface on one of the sides in the thickness direction of said silicon carbide layer.

* * * * *